US008953239B2

(12) United States Patent
Menon et al.

(10) Patent No.: US 8,953,239 B2
(45) Date of Patent: Feb. 10, 2015

(54) NANOPHOTONIC SCATTERING STRUCTURE

(71) Applicant: University of Utah Research Foundation, Salt Lake City, UT (US)

(72) Inventors: Rajesh Menon, Salt Lake City, UT (US); Peng Wang, Salt Lake City, UT (US)

(73) Assignee: University of Utah Research Foundation, Salt Lake City, UT (US)

( * ) Notice: Subject to any disclaimer, the term of this patent is extended or adjusted under 35 U.S.C. 154(b) by 0 days.

(21) Appl. No.: 14/019,099

(22) Filed: Sep. 5, 2013

(65) Prior Publication Data

US 2014/0063587 A1    Mar. 6, 2014

Related U.S. Application Data

(60) Provisional application No. 60/696,955, filed on Sep. 5, 2012.

(51) Int. Cl.
*G02B 26/00* (2006.01)
*G06F 17/50* (2006.01)
*G02B 26/08* (2006.01)
*B82Y 20/00* (2011.01)

(52) U.S. Cl.
CPC ........... *G06F 17/50* (2013.01); *G02B 26/08* (2013.01); *G06F 17/5068* (2013.01); *B82Y 20/00* (2013.01)
USPC ....................................................... 359/291

(58) Field of Classification Search
USPC ............ 359/291, 566, 569, 574, 575; 438/34; 427/162; 257/9; 716/30; 977/932
See application file for complete search history.

(56) References Cited

U.S. PATENT DOCUMENTS

| 5,344,447 A | 9/1994 | Swanson |
| 5,589,982 A | 12/1996 | Faklis et al. |
| 5,978,139 A | 11/1999 | Hatakoshi et al. |

(Continued)

FOREIGN PATENT DOCUMENTS

| EP | 1732030 | 12/2006 |
| JP | 2003139929 | 10/2008 |

(Continued)

OTHER PUBLICATIONS

Carreira-Perpinan et al; Gaussian Mean-Shift is an EM Algorithm; IEEE Transactions on Pattern Analysis and Machine Intelligence; May 2007; pp. 1-14; vol. 29, No. 5.

(Continued)

*Primary Examiner* — Tuyen Tra
(74) *Attorney, Agent, or Firm* — Thorpe North & Western LLP

(57) ABSTRACT

A method of designing a nanophotonic scattering structure can include establishing an initial design having an array of discrete pixels variable between at least two pixel height levels. A performance metric for the structure can be a function of the heights of the pixels. The height of a pixel can be varied, and then the performance metric can be calculated. The steps of varying the pixel height and calculating the performance metric can be repeated to increase the performance metric. The above steps can be repeated for each pixel within the array and then the method can be iterated until the performance metric reaches an optimized value. Nanophotonic scattering structures can be produced from designs obtained through this process.

19 Claims, 24 Drawing Sheets

(56) References Cited

U.S. PATENT DOCUMENTS

| | | | |
|---|---|---|---|
| 6,222,940 | B1 | 4/2001 | Wenzel et al. |
| 6,469,241 | B1 | 10/2002 | Penn |
| 6,678,429 | B2 | 1/2004 | Mossbert et al. |
| 6,707,608 | B1 | 3/2004 | Arieli et al. |
| 7,245,803 | B2 | 7/2007 | Gunn, III et al. |
| 7,260,289 | B1 | 8/2007 | Gunn, III et al. |
| 7,808,706 | B2 | 10/2010 | Fadel et al. |
| 8,033,706 | B1 | 10/2011 | Kelly et al. |
| 8,049,963 | B2 | 11/2011 | Menon et al. |
| 8,067,134 | B2 | 11/2011 | Sandstrome et al. |
| 8,311,377 | B2 | 11/2012 | Levner et al. |
| 8,427,725 | B2 | 4/2013 | Futterer et al. |
| 2003/0058538 | A1 | 3/2003 | Sugiyama et al. |
| 2006/0002504 | A1 | 1/2006 | De Man et al. |
| 2006/0050391 | A1 | 3/2006 | Backlund et al. |
| 2006/0225024 | A1 | 10/2006 | Hu et al. |
| 2006/0244969 | A1 | 11/2006 | Ryan et al. |
| 2008/0055581 | A1 | 3/2008 | Rogers et al. |
| 2010/0095999 | A1 | 4/2010 | Menon |
| 2010/0097703 | A1 | 4/2010 | Menon et al. |
| 2011/0019189 | A1 | 1/2011 | Crouse et al. |
| 2011/0095389 | A1 | 4/2011 | Cui et al. |
| 2012/0048368 | A1 | 3/2012 | Chaudhary et al. |
| 2013/0023067 | A1 | 1/2013 | Absil et al. |
| 2013/0248875 | A1* | 9/2013 | Lin et al. .......... 257/76 |

FOREIGN PATENT DOCUMENTS

| | | |
|---|---|---|
| WO | WO2012/051613 | 4/2012 |
| WO | WO2012/169889 | 12/2012 |

OTHER PUBLICATIONS

Gil et al; The Promise of Diffractive Optics in Maskless Lithography; Journal of Microelectronic Engineering; Jun. 2004; pp. 35-41; vol. 73-74, No. 1.

Henry; Limiting Efficiences of Ideal Single and Multiple Energy Gap Terrestrial Solar Cells; J. Appl. Phys.; Aug. 1980; pp. 4494-4500; vol. 51, No. 8.

Menon et al; Design of Diffractive Lenses that Generate Optical Nulls Without Phase Singularities; J. Opt. Soc. Am. A; Feb. 2009; pp. 297-304.

Tsai et al; Reduction of Focal-Spot Size Using Dichromats in Absorbance Modulation; Optics Letters; Dec. 15, 2008; pp. 2916-2918; vol. 33, No. 24.

Dominguez-Caballero; Design and Sensitivity Analysis of Fresnel Domain Computer Generated Holograms; Int. J. Nanomanufacturing; Aug. 23, 2010; pp. 207-218; vol. 6, No. 1—Apr. 2010.

Gerchberg et al; A Practical Algorithm for the Determination of the Phase From Image and Diffraction Plane Pictures; 1972; Optik; pp. 237-246; vol. 35, No. 2.

Goodman; Introduction to Fourier Optics; Chapter 3; pp. 31-57; 2004.

Galus; Replication of Diffractive-Optical Arrays via Photocurable Nanoimprint Lithography; J. Vac. Sci. Technol. B; 2006; pp. 2960-2963; vol. 24, No. 6.

Hajimirza, et al.; "Using inverse analysis to find optimum nano-scale radiative surface patterns to enhance solar cell performance"; International Journal of Thermal Sciences, vol. 62 (2012) pp. 93-102.

Lu; "Nanophotonic Computational Design"; A dissertation submitted to the department of Electrical Engineering and the committee on graduate studies of Stanford University in partial fulfillment of the requirements for the degree of doctor of philosophy; Jun. 2013.

Xie, et al.; "Manipulating spatial light fields for micro-and nano-photonics"; Physica E; vol. 44 (2012) pp. 1109-1126.

Zheng, et al.; "Theorectical analysis of performance improvement of thin film solar cells with two-dimensional photonic crystals and distributed Bragg reflector textured structures"; Optics Communications; 2013; 1 page.

Yu, et al.; "Fundamental Limit of Nanophotonic Light-trapping in Solar Cells"; Jul. 14, 2012; pp. 2-3.

Dewan et al.; "Light Trapping in Thin-film Silicon Solar Cells with Submicron Surface Texture"; Dec. 7, 2009; vol. 17, No. 25.

Ferry et al.; "Light Trapping in Ultrathin Plasmonic Solar Cells"; Jun. 21, 2010; col. 18, No. 102.

Green et al.; "Forty Three Percent Composite Split-spectrum Concentrator Solar Cell Efficicency"; 2010; vol. 18, pp. 42-47.

Barnett et al.; "Milestones Toward 50% Efficient Solar Cell Modules"; Sep. 3, 2007.

Wang et al.; "Simulation and Optimization of 1-D Periodic Dielectric Nanostructures for Light-trapping"; Jan. 16, 2012; vol. 20, No. 2.

Kim et al.; "Design and Analysis of Multi-wavelength Diffractive Optics"; Jan. 16, 2012; vol. 20; No. 2.

Boerner et al.; "Microstructured Light Management Films for Information Displays Generated by Holography"; May 2002; vol. 33, Issue 1, pp. 826-829.

* cited by examiner

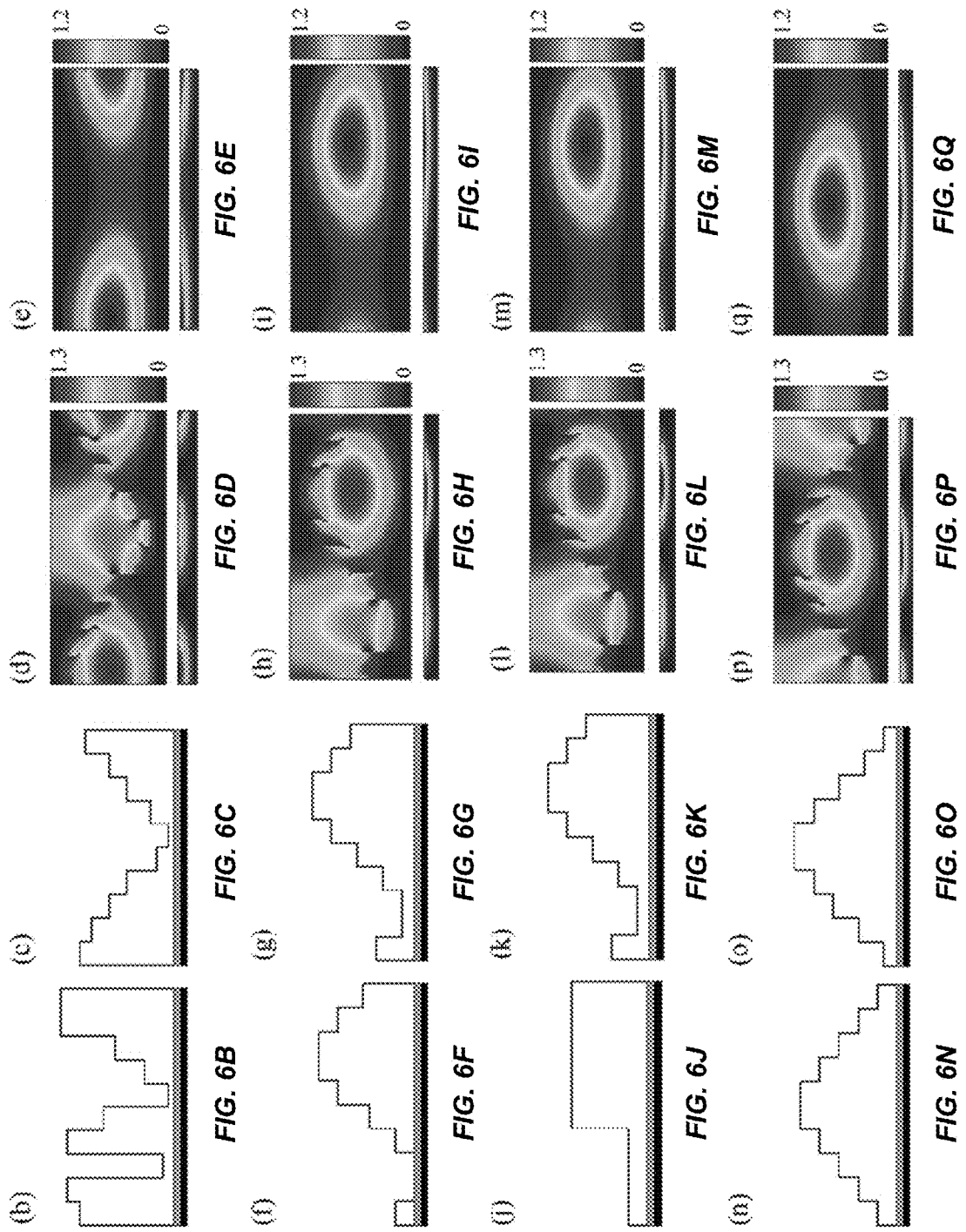

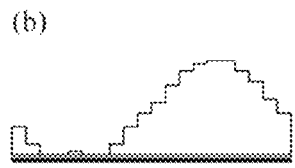
FIG. 7B
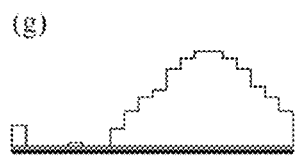
FIG. 7G
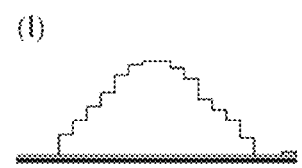
FIG. 7L
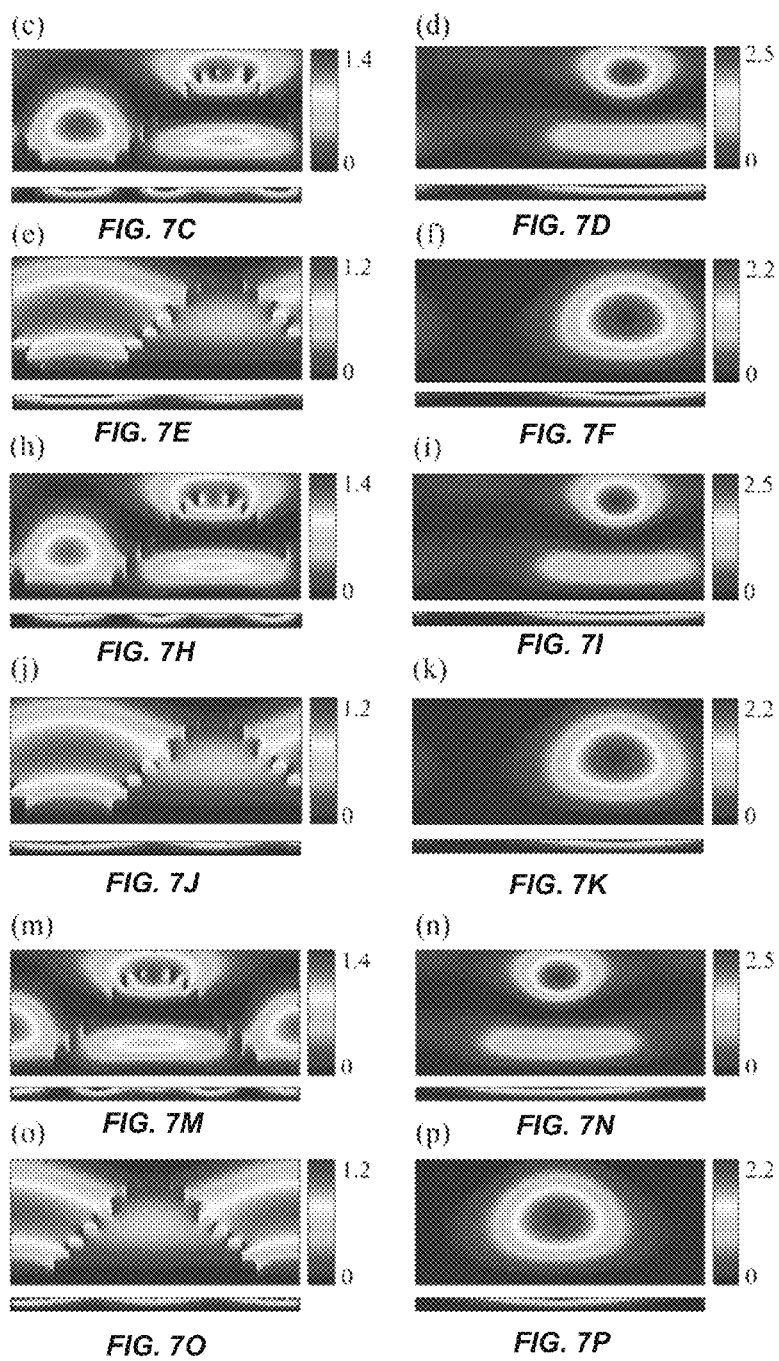
FIG. 7C  FIG. 7D
FIG. 7E  FIG. 7F
FIG. 7H  FIG. 7I
FIG. 7J  FIG. 7K
FIG. 7M  FIG. 7N
FIG. 7O  FIG. 7P

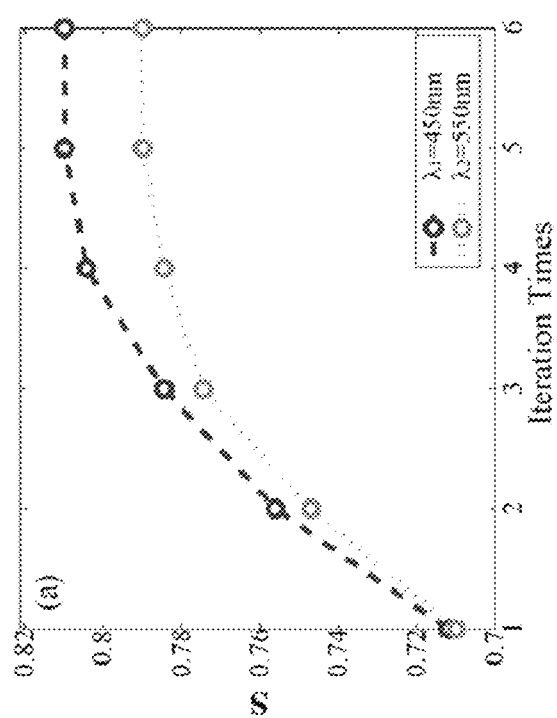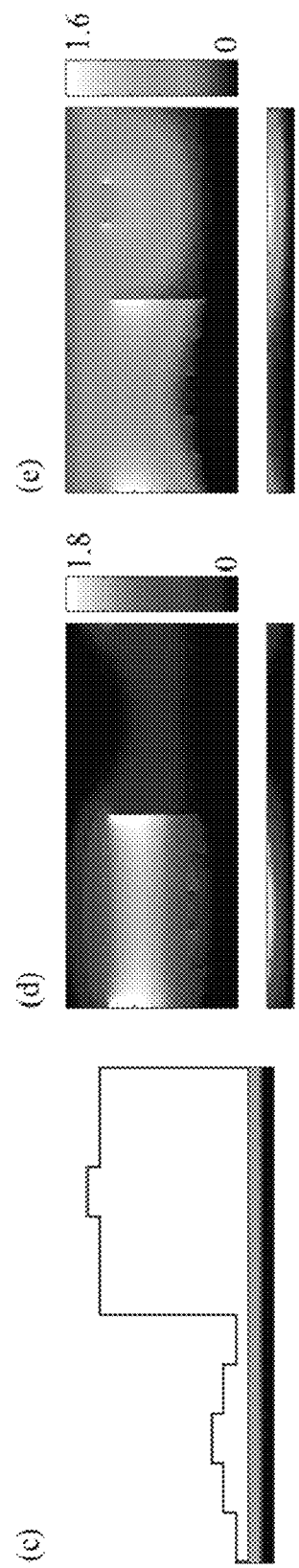
FIG. 15A
FIG. 15B
FIG. 15C
FIG. 15D
FIG. 15E

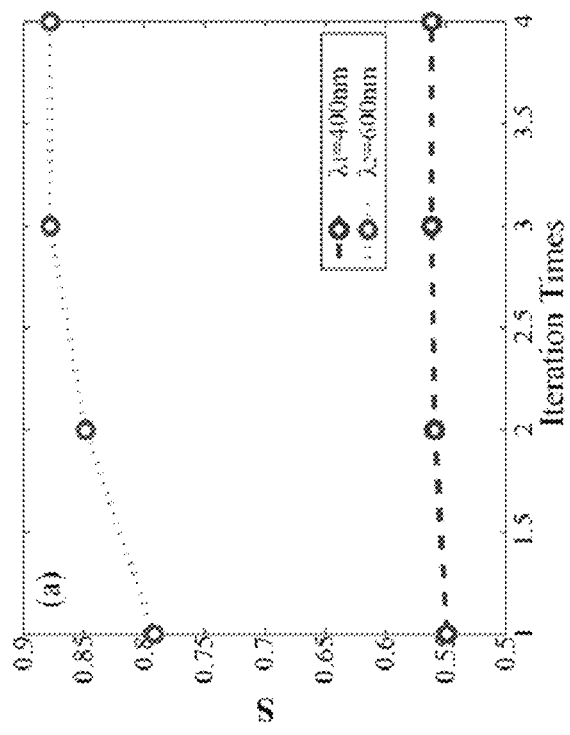
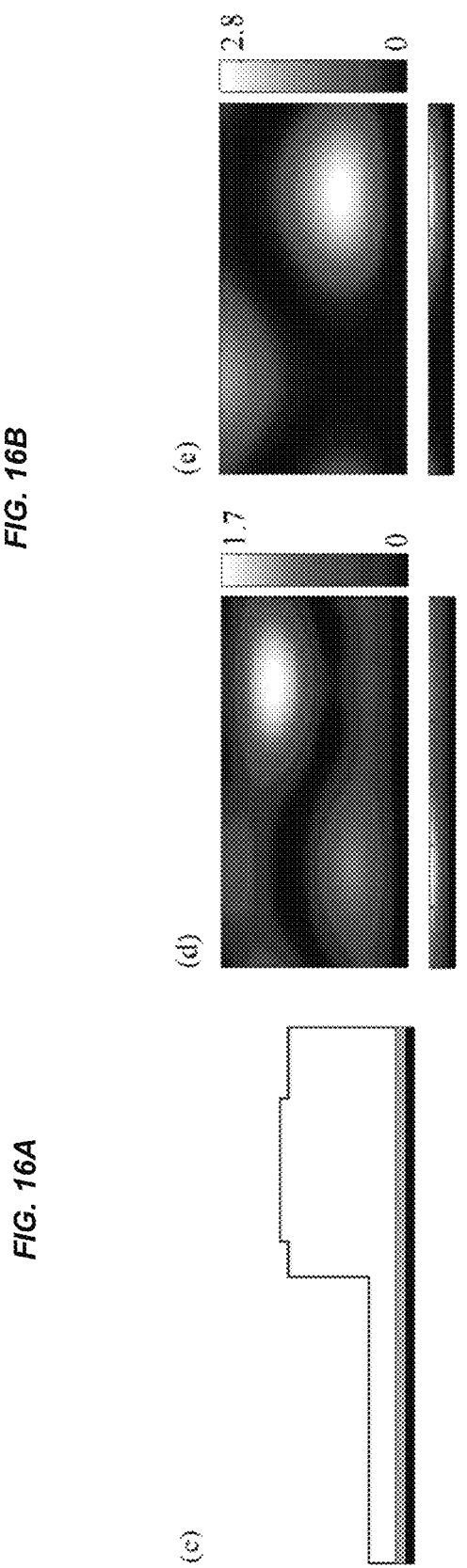
FIG. 16A
FIG. 16B
FIG. 16C
FIG. 16D
FIG. 16E

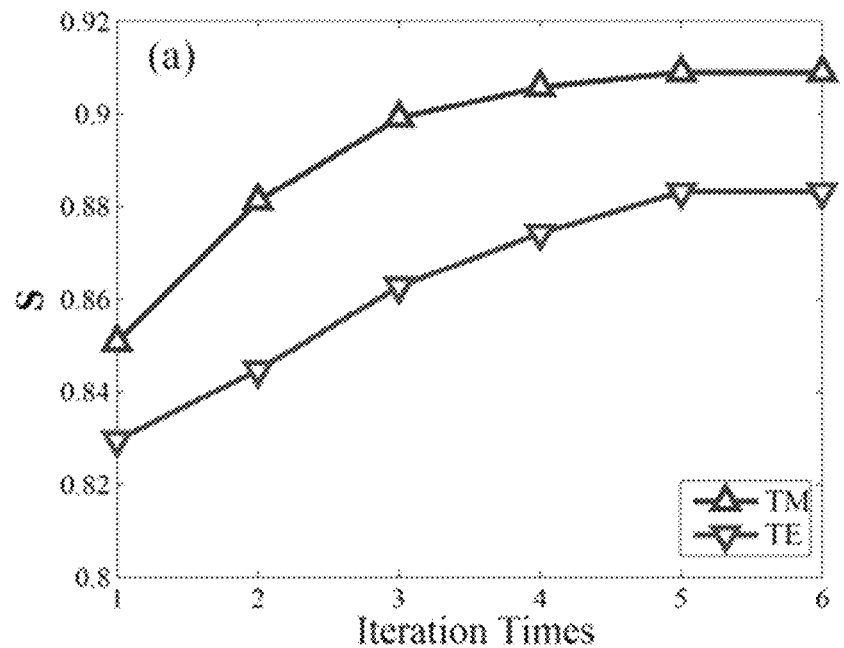
FIG. 17A
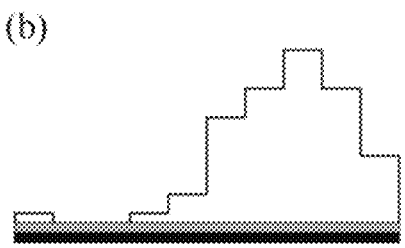
FIG. 17B
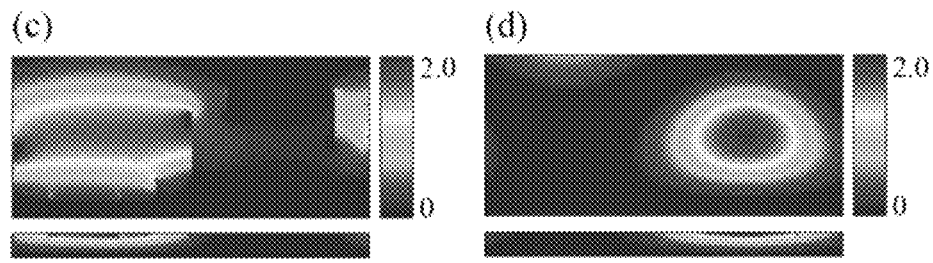
FIG. 17C  FIG. 17D

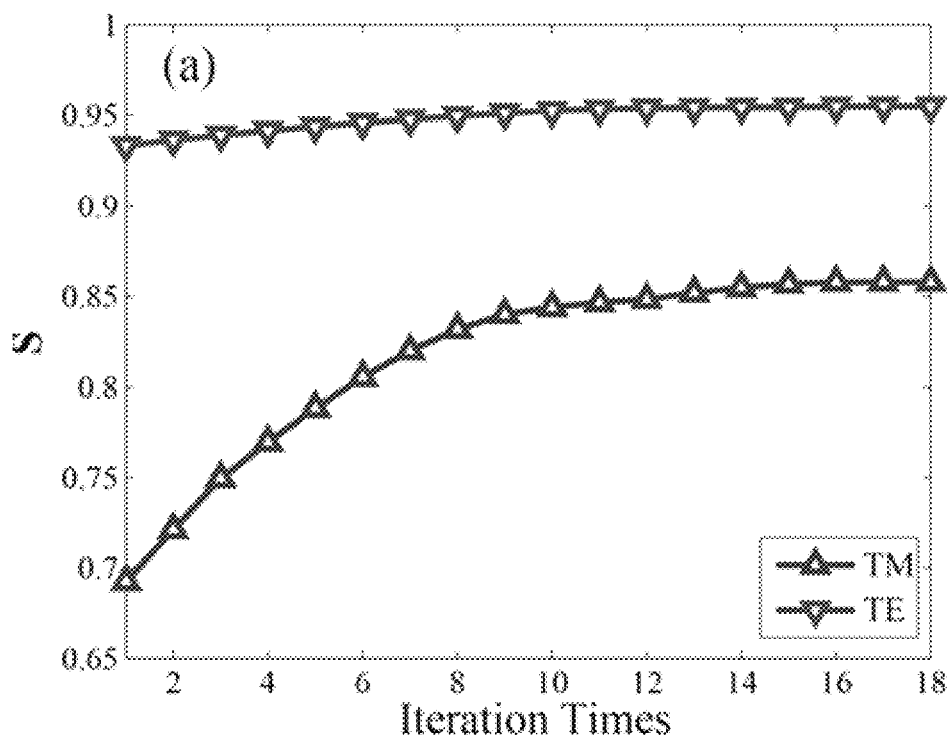
FIG. 18A
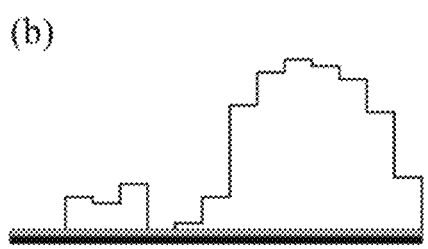
FIG. 18B
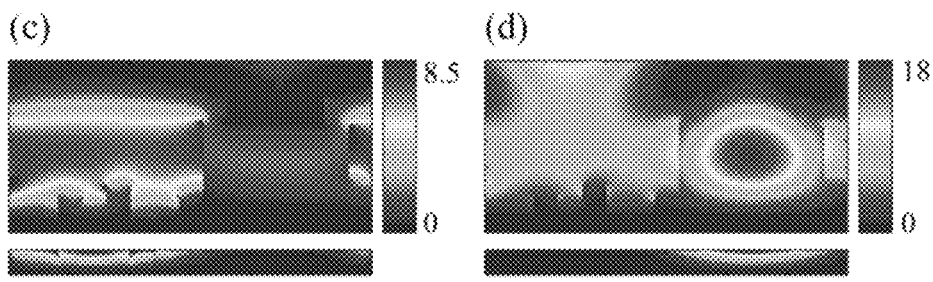
FIG. 18C     FIG. 18D

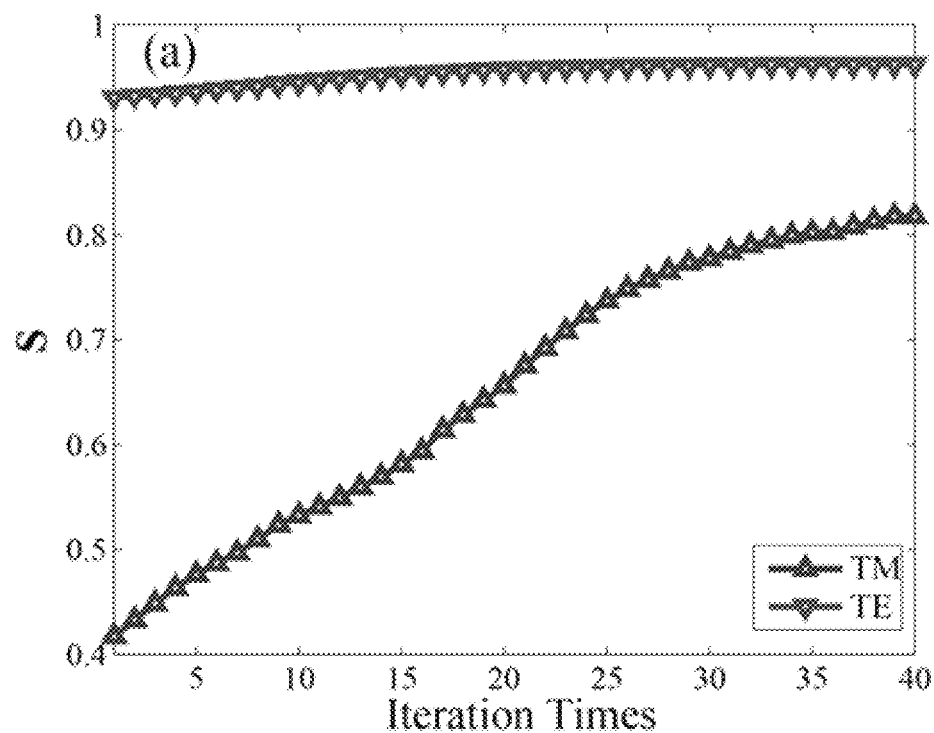
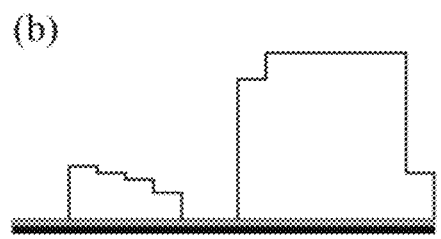
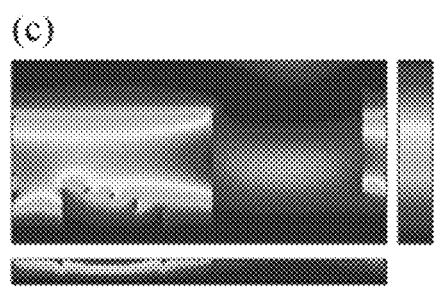
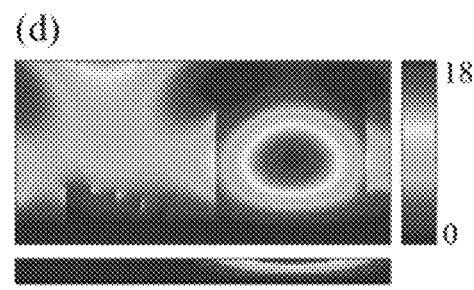
FIG. 20A
FIG. 20B
FIG. 20C
FIG. 20D

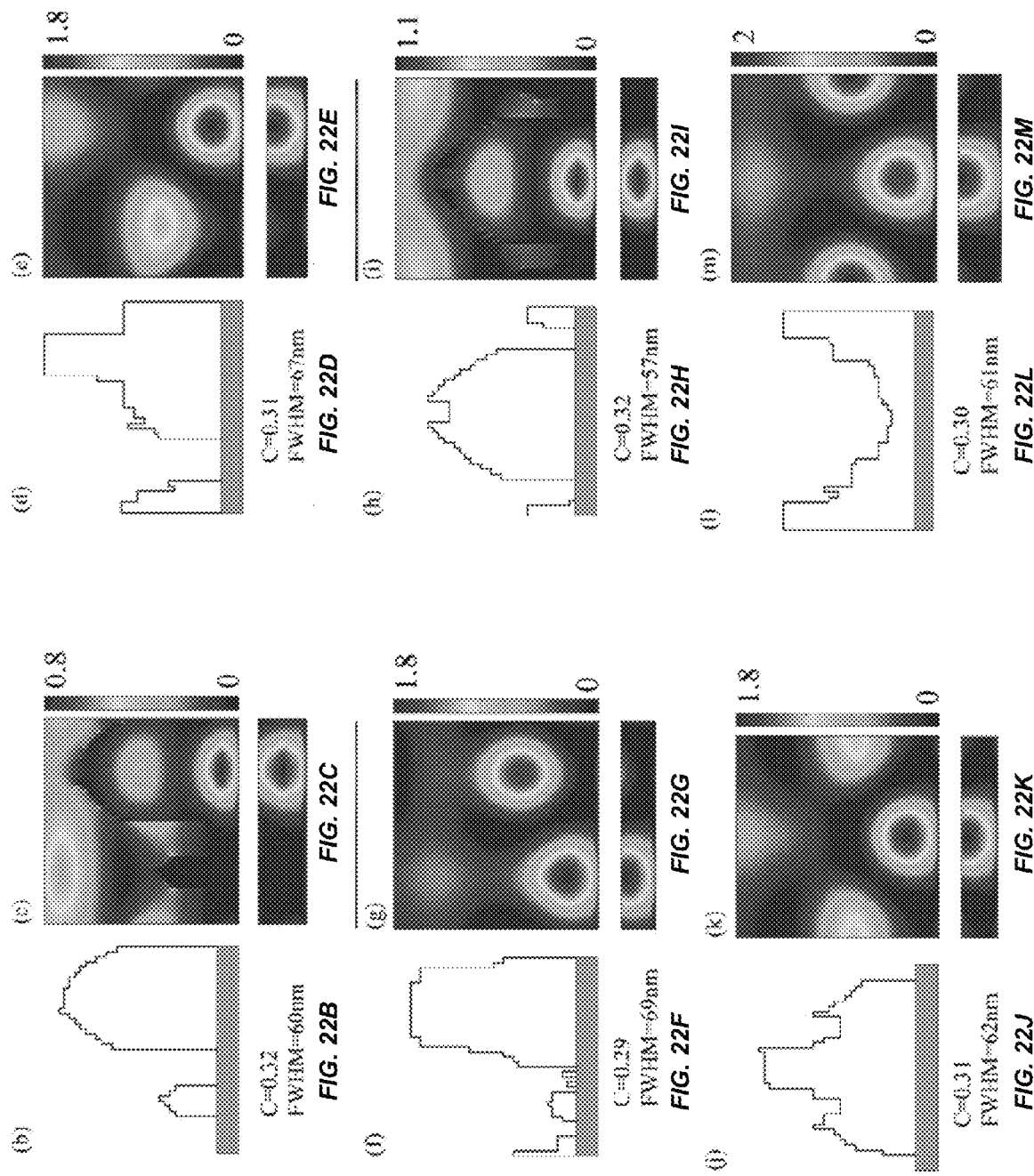

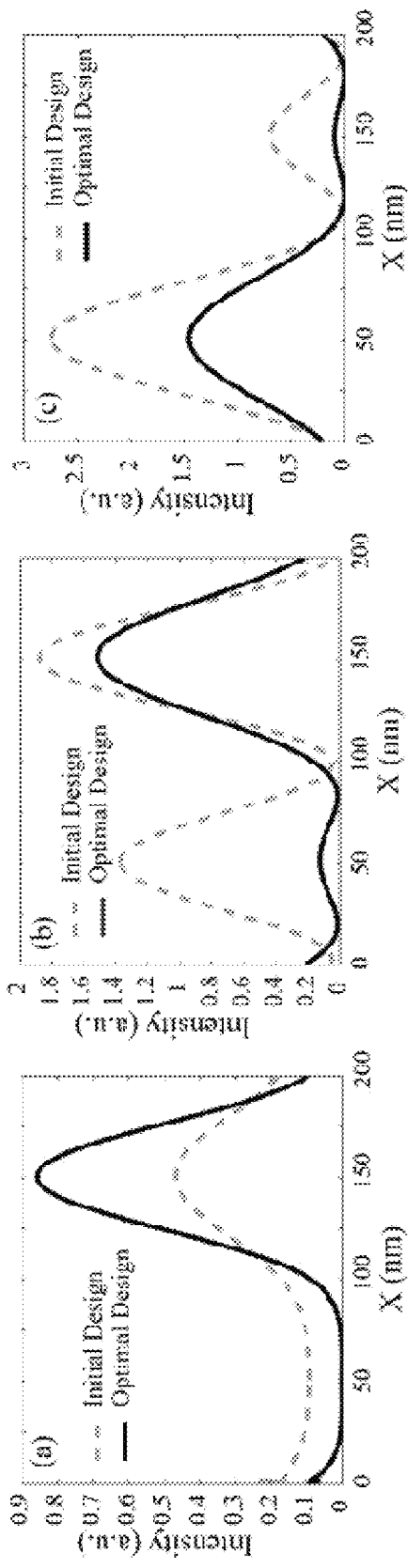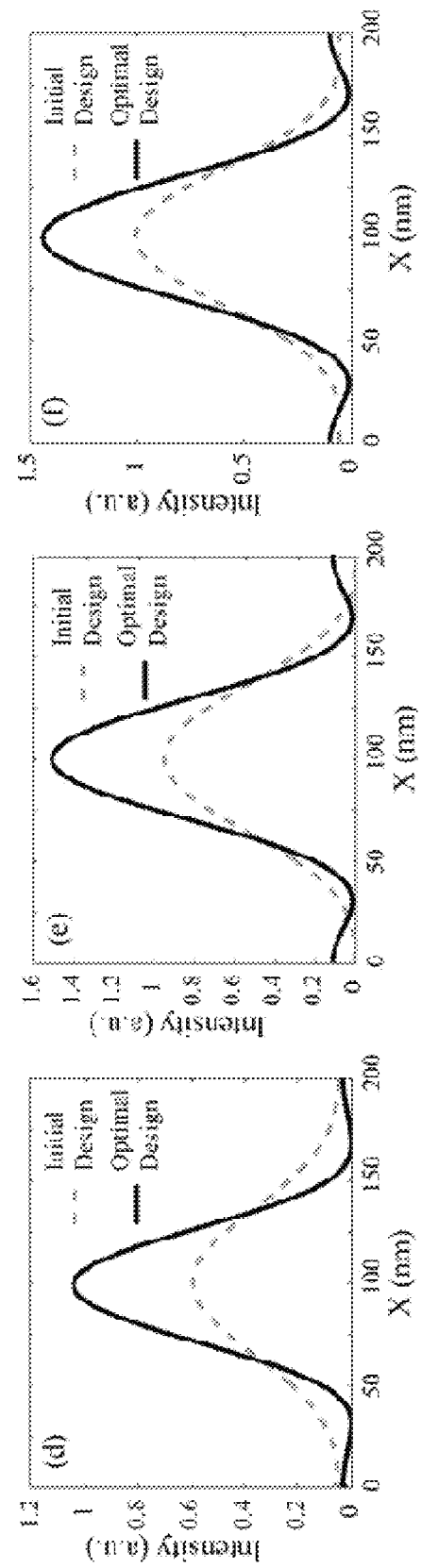
FIG. 23C
FIG. 23F
FIG. 23B
FIG. 23E
FIG. 23G
FIG. 23D

NANOPHOTONIC SCATTERING STRUCTURE

RELATED APPLICATION

This application claims the benefit of U.S. Provisional Application No. 61/696,955 entitled Nanophotonic Scattering Structure, filed Sep. 5, 2012, and which is incorporated herein by reference.

BACKGROUND

Solar energy has the potential to become a significant source of energy in the near future. However, high costs associated with active device materials have been an obstacle to their wide adoption. Material cost can be contained via the use of thin layers of active materials. In addition, thin-film photovoltaic cells have higher open-circuit voltages due to correspondingly lower recombination rates. Furthermore, such cells can be manufactured using considerably cheaper processes. The main drawback of such cells is their poor absorption of sunlight. Light trapping schemes have been proposed to increase the light absorption in their thin active layers. Some such schemes have included randomly textured surfaces applied on the top surface of the thin active layer. Light scattering from these textures increases the path length within the active material resulting in higher absorption. Such textures have typically been used with active layers several microns thick. Sub-micrometer grating structures on the bottom surface of the active layer have also been used to increase light absorption in such devices.

SUMMARY

A method of designing a nanophotonic scattering structure in accordance with an embodiment of the present invention can include establishing an initial design that has an active layer and an adjacent scattering layer. The scattering layer can have an array of discrete pixels wherein each discrete pixel has a geometric profile and is variable between at least two pixel height levels. The method can further include identifying a performance metric for the nanophotonic scattering structure and varying a height of a pixel from the array of discrete pixels among the at least two pixel height levels. The performance metric is a function of the height. The performance metric can be calculated for the nanophotonic scattering structure and the steps of varying the pixel height and calculating the performance metric can be repeated to increase the performance metric. If the performance metric would not be increased by varying the height of the pixel to any of the other at least two pixel height levels, then the height of the pixel can be retained without repeating these steps. The above steps can be repeated for each pixel within the array until the steps have been performed for every pixel within the array. The above steps can further be repeated until the performance metric reaches an optimized value.

A nanophotonic scattering structure in accordance with an embodiment of the present invention can be obtained by a process which can include establishing an initial design that has a back layer, an active layer, and an adjacent scattering layer. The scattering layer can have an array of discrete pixels wherein each discrete pixel has a geometric profile and is variable between at least two pixel height levels. The process can further include identifying a performance metric for the nanophotonic scattering structure and varying a height of a pixel from the array of discrete pixels among the at least two pixel height levels, where the performance metric is a function of the height. The performance metric can be calculated for the nanophotonic scattering structure and the steps of varying the pixel height and calculating the performance metric can be repeated to increase the performance metric. If the performance metric would not be increased by varying the height of the pixel to any of the other at least two pixel height levels, then the height of the pixel can be retained without repeating these steps. The above steps can be repeated for each pixel within the array until the steps have been performed for every pixel within the array. The above steps can further be repeated until the performance metric reaches an optimized value.

A nanophotonic scattering structure in accordance with an embodiment of the present invention can include a back layer, an active layer disposed over the back layer, and a scattering layer disposed over the active layer. The scattering layer can comprise an array of discrete pixels, wherein each discrete pixel has a geometric profile and a pixel height. The discrete pixels are also arranged in an irregular, non-random pattern of pixel heights.

There has thus been outlined, rather broadly, the more important features of the invention so that the detailed description thereof that follows may be better understood, and so that the present contribution to the art may be better appreciated. Other features of the present invention will become clearer from the following detailed description of the invention, taken with the accompanying drawings and claims, or may be learned by the practice of the invention.

BRIEF DESCRIPTION OF THE DRAWINGS

FIG. 6B is a random initial design;

FIG. 6C is an optimized design based on the random initial design of FIG. 6B;

FIG. 6D is a time-averaged TM mode field for the optimized design of FIG. 6C;

FIG. 6E is a time-averaged TE mode field for the optimized design of FIG. 6C;

FIG. 6F is a sinusoid-modulated grating initial design;

FIG. 6G is an optimized design based on the sinusoid-modulated initial design of FIG. 6F;

FIG. 6H is a time-averaged TM mode field for the optimized design of FIG. 6G;

FIG. 6I is a time-averaged TE mode field for the optimized design of FIG. 6G;

FIG. 6J is a square-modulated grating initial design;

FIG. 6K is an optimized design based on the square-modulated initial design of FIG. 6J;

FIG. 6L is a time-averaged TM mode field for the optimized design of FIG. 6K;

FIG. 6M is a time-averaged TE mode field for the optimized design of FIG. 6K;

FIG. 6N is a triangle-modulated grating initial design;

FIG. 6O is an optimized design based on the triangle-modulated initial design of FIG. 6N;

FIG. 6P is a time-averaged TM mode field for the optimized design of FIG. 6O;

FIG. 6Q is a time-averaged TE mode field for the optimized design of FIG. 6O;

FIG. 7B is an optimized design based on a sinusoid grating initial design;

FIG. 7C is a time-averaged TM mode field at $\lambda=500$ nm for the optimized design of FIG. 7B;

FIG. 7D is the time-averaged TE mode field at $\lambda=500$ nm for the optimized design of FIG. 7B;

FIG. 7E is the TM mode field at $\lambda=900$ nm for the optimized design of FIG. 7B;

FIG. 7F is the TE mode field at $\lambda=900$ nm for the optimized design of FIG. 7B;

FIG. 7G is an optimized design based on a square-modulated grating initial design;

FIG. 7H is a time-averaged TM mode field at $\lambda=500$ nm for the optimized design of FIG. 7G;

FIG. 7I is the time-averaged TE mode field at $\lambda=500$ nm for the optimized design of FIG. 7G;

FIG. 7J is the TM mode field at $\lambda=900$ nm for the optimized design of FIG. 7G;

FIG. 7K is the TE mode field at $\lambda=900$ nm for the optimized design of FIG. 7G;

FIG. 7L is an optimized design based on a triangle-modulated grating initial design;

FIG. 7M is a time-averaged TM mode field at $\lambda=500$ nm for the optimized design of FIG. 7L;

FIG. 7N is the time-averaged TE mode field at $\lambda=500$ nm for the optimized design of FIG. 7L;

FIG. 7O is the TM mode field at $\lambda=900$ nm for the optimized design of FIG. 7L;

FIG. 7P is the TE mode field at $\lambda=900$ nm for the optimized design of FIG. 7L;

FIG. 15A is a graph of spectrum-splitting factors versus number of iterations for Example 5, design 7;

FIG. 15B is a graph of short-circuit-current-density enhancement factor versus number of iterations for Example 5, design 7;

FIG. 15C is an optimized design for Example 5, design 7;

FIG. 15D is the time-averaged field at 450 nm;

FIG. 15E is the time-averaged field at 550 nm;

FIG. 16A is a graph of spectrum-splitting factors versus number of iterations for Example 5, design 8;

FIG. 16B is a graph of short-circuit-current-density enhancement factor versus number of iterations for Example 5, design 8;

FIG. 16C is an optimized design for Example 5, design 8;

FIG. 16D is the time-averaged field at 450 nm;

FIG. 16E is the time-averaged field at 550 nm;

FIG. 17A is a graph of polarization-splitting factor versus number of iterations for Example 6, design 9;

FIG. 17B is an optimized design for design 9;

FIG. 17C is a time-averaged field of the TM mode for design 9;

FIG. 17D is a time-averaged field of the TE mode for design 9;

FIG. 18A is a graph of polarization-splitting factor versus number of iterations for Example 6, design 10;

FIG. 18B is an optimized design for design 10;

FIG. 18C is a time-averaged field of the TM mode for design 10;

FIG. 18D is a time-averaged field of the TE mode for design 10;

FIG. 20A is a graph of polarization-splitting factor versus number of iterations for Example 6, design 12;

FIG. 20B is an optimized design for design 12;

FIG. 20C is a time-averaged field of the TM mode for design 12;

FIG. 20D is a time-averaged field of the TE mode for design 12;

FIG. 22B is an optimized design for design 1;

FIG. 22C is the light field of the TM mode for design 1;

FIG. 22D is an optimized design for design 2;

FIG. 22E is the light field of the TE mode for design 2;

FIG. 22F is an optimized design for design 3;

FIG. 22G is the light field of the TE mode for design 3;

FIG. 22H is an optimized design for design 4;

FIG. 22I is the light field of the TM mode for design 4;

FIG. 22J is an optimized design for design 5;

FIG. 22K is the light field of the TE mode for design 5;

FIG. 22L is an optimized design for design 6;

FIG. 22M is the light field of the TE mode for design 6;

FIG. 23A is a plot of light intensity along the boundary between the cladding layer and the free propagation layer for initial and optimized designs for Example 7, design 1;

FIG. 23B is a plot of light intensity along the boundary between the cladding layer and the free propagation layer for initial and optimized designs for Example 7, design 2;

FIG. 23C is a plot of light intensity along the boundary between the cladding layer and the free propagation layer for initial and optimized designs for Example 7, design 3;

FIG. 23D is a plot of light intensity along the boundary between the cladding layer and the free propagation layer for initial and optimized designs for Example 7, design 4;

FIG. 23E is a plot of light intensity along the boundary between the cladding layer and the free propagation layer for initial and optimized designs for Example 7, design 5; and FIG. 23F is a plot of light intensity along the boundary between the cladding layer and the free propagation layer for initial and optimized designs for Example 7, design 6.

Figure 1:
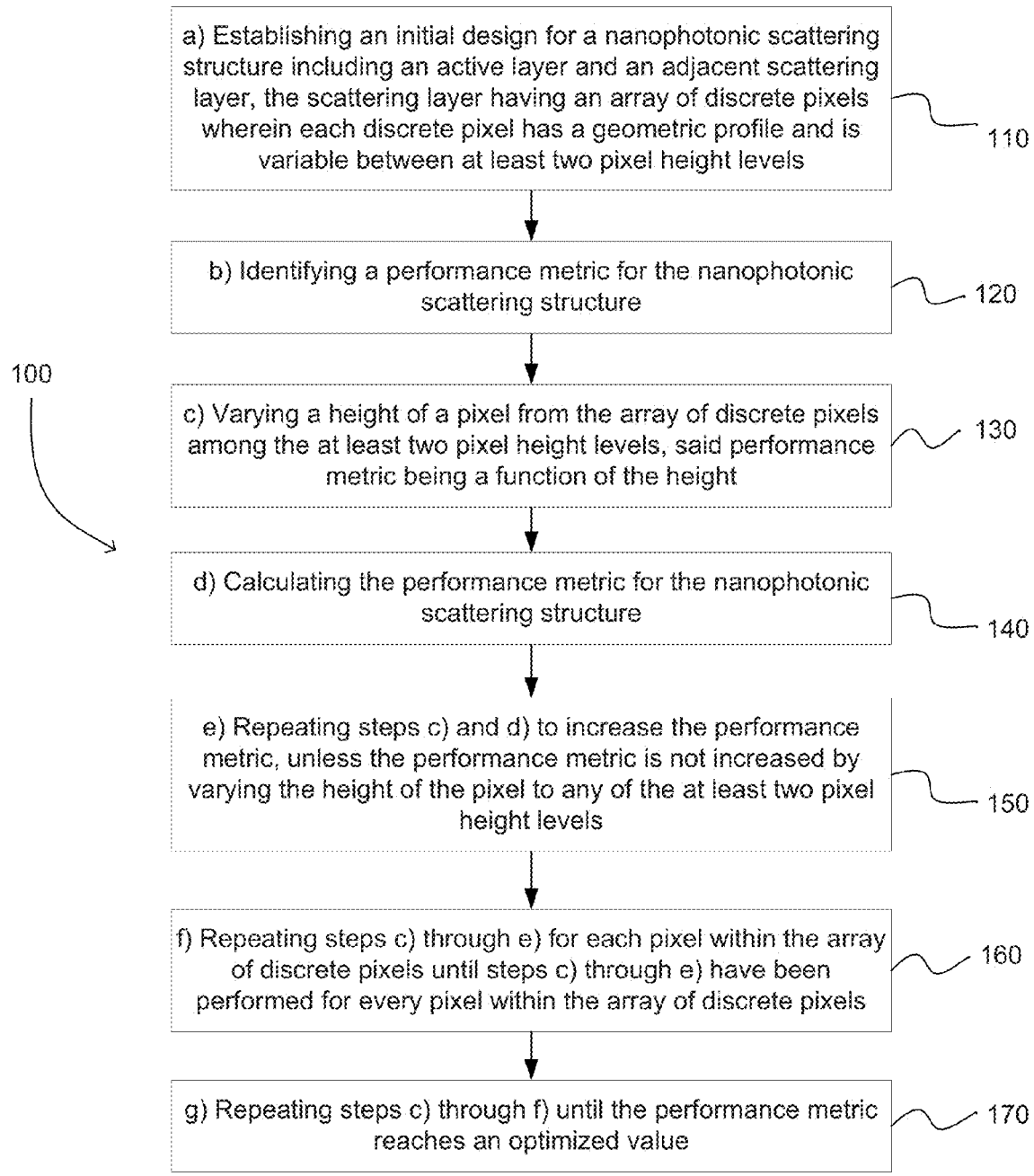
FIG. 1 is a flow chart showing a method in accordance with an embodiment of the present technology.

These drawings are provided to illustrate various aspects of the invention and are not intended to be limiting of the scope in terms of dimensions, materials, configurations, arrangements or proportions unless otherwise limited by the claims.

DETAILED DESCRIPTION

While these exemplary embodiments are described in sufficient detail to enable those skilled in the art to practice the invention, it should be understood that other embodiments may be realized and that various changes to the invention may be made without departing from the spirit and scope of the present invention. Thus, the following more detailed description of the embodiments of the present invention is not intended to limit the scope of the invention, as claimed, but is presented for purposes of illustration only and not limitation to describe the features and characteristics of the present invention, to set forth the best mode of operation of the invention, and to sufficiently enable one skilled in the art to practice the invention. Accordingly, the scope of the present invention is to be defined solely by the appended claims.

DEFINITIONS

In describing and claiming the present invention, the following terminology will be used.

As used herein, the terms "light", "illumination" and "electromagnetic radiation" can be used interchangeably and can refer to light or electromagnetic radiation in the ultraviolet, visible, near infrared and infrared spectra. The terms can furthermore broadly include electromagnetic radiation such as radio waves, microwaves, x-rays, and gamma rays. Thus, the term "light" is not limited to electromagnetic radiation in the visible spectrum.

As used herein, a "substrate" can refer to any of a variety of materials, layers, composite, etc. For example, in terms of a semiconductor, the "substrate" may refer to a silicon wafer, or may refer to any of a variety of dielectric, conductive, or other layers in the semiconductor. Other materials can be used as a substrate as well. In some cases, the substrate may be rigid. However, flexible substrates can also be used. For purposes of this disclosure, the substrate can generically refer to a layer or material capable of supporting another layer or material thereon.

It is noted that, as used in this specification and in the appended claims, the singular forms "a," "an," and "the" include plural referents unless the context clearly dictates otherwise. Thus, for example, reference to "a layer" includes one or more of such features, reference to "a pixel" includes reference to one or more of such elements, and reference to "varying" includes reference to one or more of such steps.

As used herein, the terms "about" and "approximately" are used to provide flexibility, such as to indicate, for example, that a given value in a numerical range endpoint may be "a little above" or "a little below" the endpoint. The degree of flexibility for a particular variable can be readily determined by one skilled in the art based on the context.

As used herein, the term "substantially" refers to the complete or nearly complete extent or degree of an action, characteristic, property, state, structure, item, or result. The exact allowable degree of deviation from absolute completeness may in some cases depend on the specific context. However, the nearness of completion will generally be so as to have the same overall result as if absolute and total completion were obtained. The use of "substantially" is equally applicable when used in a negative connotation to refer to the complete or near complete lack of an action, characteristic, property, state, structure, item, or result.

As used herein with respect to an identified property or circumstance, "substantially" refers to a degree of deviation that is sufficiently small so as to not measurably detract from the identified property or circumstance. The exact degree of deviation allowable may in some cases depend on the specific context.

As used herein, "adjacent" refers to the proximity of two structures or elements. Particularly, elements that are identified as being "adjacent" may be either abutting or connected. Such elements may also be near or close to each other without necessarily contacting each other. The exact degree of proximity may in some cases depend on the specific context.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a numerical range of about 1 to about 4.5 should be interpreted to include not only the explicitly recited limits of 1 to about 4.5, but also to include individual numerals such as 2, 3, 4, and sub-ranges such as 1 to 3, 2 to 4, etc. The same principle applies to ranges reciting only one numerical value, such as "less than about 4.5," which should be interpreted to include all of the above-recited values and ranges. Further, such an interpretation should apply regardless of the breadth of the range or the characteristic being described.

Any steps recited in any method or process claims may be executed in any order and are not limited to the order presented in the claims unless otherwise stated. Means-plus-function or step-plus-function limitations will only be employed where for a specific claim limitation all of the following conditions are present in that limitation: a) "means for" or "step for" is expressly recited; and b) a corresponding function is expressly recited. The structure, material or acts that support the means-plus function are expressly recited in the description herein. Accordingly, the scope of the invention should be determined solely by the appended claims and their legal equivalents, rather than by the descriptions and examples given herein.

Nanophotonic Scattering Structures

Reference will now be made to the exemplary embodiments illustrated, and specific language will be used herein to describe the same. It will nevertheless be understood that no limitation of the scope of the technology is thereby intended. Additional features and advantages of the technology will be apparent from the detailed description which follows, taken in conjunction with the accompanying drawings, which together illustrate, by way of example, features of the technology.

With the general examples set forth in the Summary above, it is noted in the present disclosure that when describing the system, or the related devices or methods, individual or separate descriptions are considered applicable to one another, whether or not explicitly discussed in the context of a particular example or embodiment. For example, in discussing a device per se, other device, system, and/or method embodiments are also included in such discussions, and vice versa.

Furthermore, various modifications and combinations can be derived from the present disclosure and illustrations, and as such, the following figures should not be considered limiting.

The present technology provides nanophotonic devices and methods of making and/or using nanophotonic devices that can enable a variety of unique functionalities. For example, nanophotonic scattering structures can be applied to light-trapping for photovoltaics, spectrum-splitting for photovoltaics, light management for displays, and other applications. The described design method enables substantial improvements of existing optics and an entirely new class of optical devices based on near-field optics.

Figure 2:
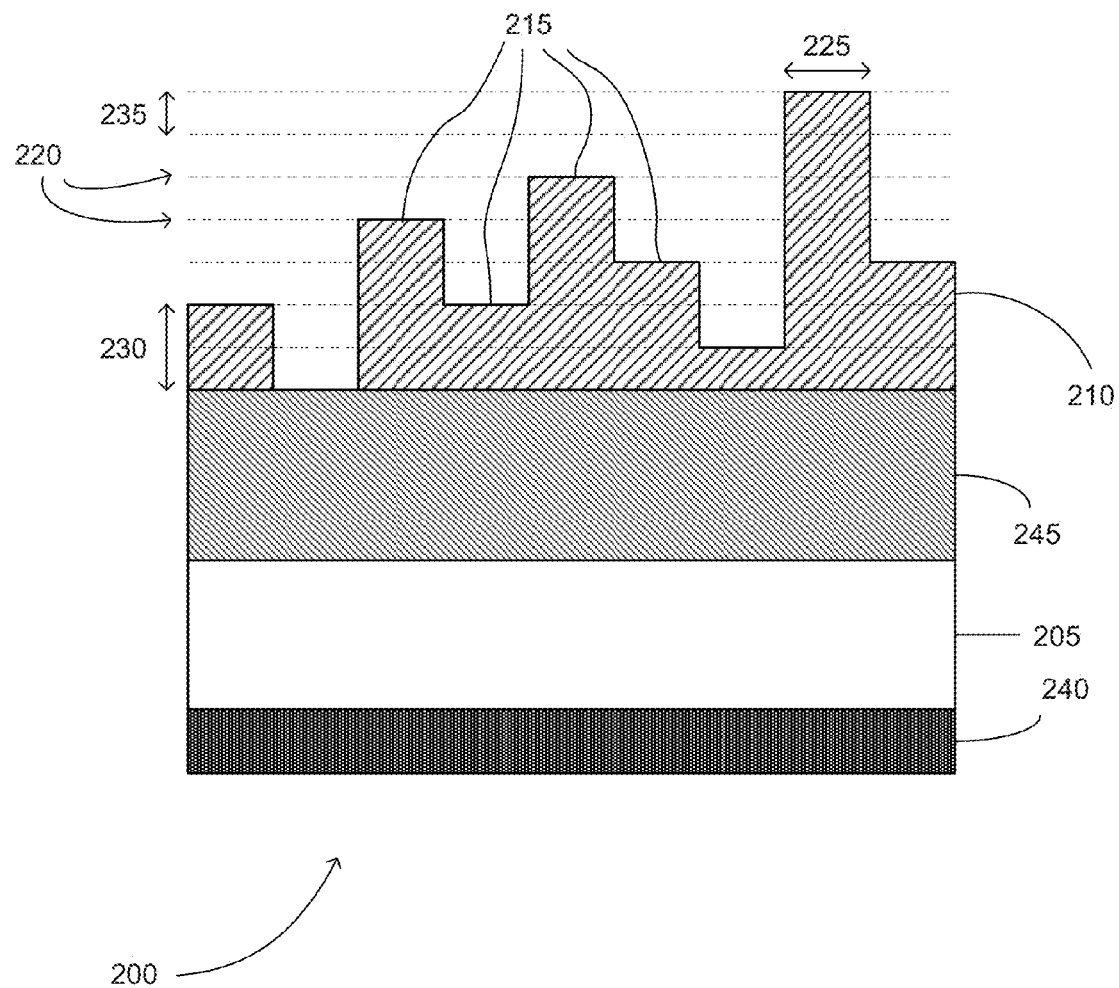
FIG. 2 is a cross-section illustration of a nanophotonic scattering structure in accordance with an embodiment of the present technology.

Referring to FIG. 1, a flow diagram of a method 100 is shown which can be used to design nanophotonic scattering structures. The method of designing a nanophotonic scattering structure can include establishing 110 an initial design for the nanophotonic scattering structure. The initial design can include an active layer and an adjacent scattering layer. Referring now to FIG. 2, a nanophotonic scattering structure 200 is depicted. The active layer 205 and scattering layer 210 can be composed of various materials to suit various applications. For example, in a solar cell, the active layer can include, but is not limited to, crystalline silicon, amorphous silicon, cadmium telluride, copper indium selenide, copper indium sulfide, gallium arsenide, polymers, and other light-absorbing materials. Different materials with different band gaps can be used for solar cells that absorb different wavelengths of light.

The active layer can also vary in width depending on specific designs. However, as a general rule the active layer can have a thickness from about 10 nm to about 5 microns. The scattering layer can be a transparent material such as transparent plastic, photoresist, polymethylmethacrylate (PMMA), glass, fused silica, silica, quartz, fused quartz, other polymers or materials that are transparent to the wavelengths of interest. The scattering layer can also be a material that is easily fabricated having a pixelated surface having varying height levels across the layer.

The scattering layer can include an array of discrete pixels 215. Each pixel can have a geometric profile and can be variable between at least two pixel height levels 220. For example, the pixels can have a rectangular geometric profile. Each pixel represents a possible local height of the scattering layer, which can be selected from among the pixel height levels. In some embodiments, the scattering layer can have a binary pattern in which the pixels are variable between exactly two pixel height levels. In other embodiments, the pixels can be variable between more than two pixel height levels. The width 225 and height 230 of each pixel can be a design parameter. In the multi-level case, the allowed heights for each pixel can also be design parameters. These parameters can typically be chosen based on the wavelengths of interest as well as fabrication constraints. For example, an upper bound can be applied on the pixel height to ensure ease of fabrication. The pixel width can also be chosen based on fabrication technology. Thus, pixel height level distances, maximum pixel heights and other parameters can be set for a particular application and desired resolution. Without being limited to specific parameters, pixel height increments can often vary from about 1 nm to 200 nm, while maximum pixel height can often range from 100 nm to about 3000 nm.

The initial design can further include an initial pattern of pixel heights 230 for the array of discrete pixels 215. The initial pattern can be any pattern. For example, in one embodiment the initial pattern can be a random pattern in which the pixel heights are randomly chosen for each pixel in the array. In another embodiment, the initial pattern can be a flat pattern in which every pixel has the same height to form a layer of uniform thickness. In other embodiments, the initial pattern can include pixel heights chosen to conform to a grating profile, such as a sinusoid grating pattern, a square grating pattern, or a triangle grating pattern. The initial pattern is a starting point from which the pixel heights can deviate as the pixels heights are varied throughout the process of optimizing the performance metric. Some initial patterns can be more advantageous for certain applications, for example by reducing the time required for the performance metric to converge. However, in many cases the method can converge on a single globally optimized design no matter what initial pattern was used. Also, in some embodiments, the initial design can be a one-dimensional design, in which the pixel heights vary in one dimension. In other embodiments, the initial design can be a two dimensional design, in which the pixel heights vary in two dimensions. In the one-dimensional case, the pixels are grooves (with various cross-section geometries), while in the two-dimensional case, the pixels can be squares, rectangles, circles or other 2D geometries.

Variations of pixel heights can affect performance of the associated nanophotonic scattering structure. Referring back to FIG. 1, a performance metric for the nanophotonic scattering structure can be identified 120. The performance metric can include one or more properties of the nanophotonic scattering structure that are desired to be optimized. These properties can be different depending on the function of the nanophotonic scattering structure. One of skill in the art will appreciate that choosing an appropriate performance metric for a particular nanophotonic scattering structure can help to optimize the performance of the nanophotonic scattering structure, whatever the function of the nanophotonic scattering structure might be. For example, in one embodiment the nanophotonic scattering structure can be a photovoltaic device and the performance metric can include current generation within the active layer. In another embodiment, the nanophotonic scattering structure can be a spectrum splitting device having at least two spectral regions within the active layer, and the performance metric can include both a short circuit current density enhancement factor and a spectrum splitting factor. In yet another embodiment, the nanophotonic scattering structure can be a polarization-splitting device, and the performance metric can include a polarization splitting factor in transverse magnetic and transverse electric modes. In another embodiment, the nanophotonic scattering structure can be a focusing element, and the performance metric can include a focusing efficiency. In another embodiment, the nanophotonic structure can be a polarization rotating element or a polarization rotating and splitting element. In another embodiment, the nanophotonic structure may be used to generate or manipulate beams with orbital angular momentum.

In some embodiments, the nanophotonic scattering structure can be a solar cell. Because the sun moves relative to the solar cell, the solar cell can be optimized for a broad range of incident light angles. Therefore, the performance metric can include factors that are related to enhanced power generation with a broad range of incident angles. Such factors include a spectral light intensity enhancement factor $F(\lambda, \theta)$, a spectrally-cumulative light intensity enhancement factor $F(\theta)$, a spectral short circuit current density enhancement factor $J(\lambda, \theta)$, and a spectrally cumulative short circuit current density enhancement factor $J(\theta)$, which are defined by Equations 1.1-1.4 below:

$$F(\lambda, \theta) = \frac{\frac{1}{\Lambda}\iint_{active} I(x, y, \lambda, \theta)dxdy}{\frac{1}{\Lambda_{ref}}\iint_{active} I_{ref}(x, y, \lambda, \theta)dxdy} \quad (1.1)$$

$$F(\theta) = \frac{\frac{1}{\Lambda}\int_\lambda \left(\iint_{active} I(x, y, \lambda, \theta)dxdy\right)d\lambda}{\frac{1}{\Lambda_{ref}}\int_\lambda \left(\iint_{active} I_{ref}(x, y, \lambda, \theta)dxdy\right)d\lambda} \quad (1.2)$$

$$J(\lambda, \theta) = \frac{\frac{q}{t_a\Lambda}\iint_{active} \frac{I(x, y, \lambda, \theta)}{hc/\lambda}IQE(\lambda)dxdy}{\frac{q}{t_a\Lambda_{ref}}\iint_{active} \frac{I_{ref}(x, y, \lambda, \theta)}{hc/\lambda}IQE(\lambda)dxdy} \quad (1.3)$$

$$J(\theta) = \frac{\frac{q}{t_a\Lambda}\int_\lambda \left(\iint_{active} \frac{I(x, y, \lambda, \theta)}{hc/\lambda} \cdot IQE(\lambda)dxdy\right)d\lambda}{\frac{q}{t_a\Lambda_{ref}}\int_\lambda \left(\iint_{active} \frac{I_{ref}(x, y, \lambda, \theta)}{hc/\lambda} \cdot IQE(\lambda)dxdy\right)d\lambda} \quad (1.4)$$

where the terms in Equations 1.1-1.4 are defined as follows: $\lambda$ is the wavelength of light, $\theta$ is the incident angle, q is the electronic charge, $t_a$ is the thickness of the active layer, $\Lambda$ is the period of the scattering structure, h is Planck's constant, c is velocity of light in the medium, and I is intensity of light, x and y are position coordinates, and IQE is the internal quantum efficiency of the device.

The height of a pixel from the array of discrete pixels can be varied 130 among the at least two pixel height levels. The performance metric can be a function of the pixel height, so the performance metric can change when the pixel height is varied. In binary designs, the pixels can only have two possible height levels. A pixel in such a design is either "up" or "down," so the step of varying the pixel height can be either raising the pixel to the upper possible height level or lowering the pixel to the lower possible height level. In a multi-level design, the pixels can vary between more than two height levels. In these designs, the step of varying the pixel height can be changing the pixel height to any of the other possible height levels. In some embodiments, the height of the pixel can be varied by a single pre-defined pixel height unit. FIG. 2 shows a pre-defined pixel height unit 235 between the pixel height levels 220. In other embodiments, the pixel height can be varied by multiple pre-defined pixel height units, or by an arbitrary change in pixel height. One of skill in the art will appreciate that adjusting the magnitude of the changes in pixel height can affect the stability of the convergence and the speed of convergence to an optimized design.

In accordance with the method, and referring back to FIG. 1, the performance metric for the nanophotonic scattering structure can be calculated 140. Many of the relevant performance metrics for nanophotonic scattering structures are dependent on optical fields in and around the structure. These optical fields are often calculated by numerical solution of Maxwell's equations. One particular method of solving Maxwell's equations numerically is to use the finite-difference-time-domain (FDTD) method. The FDTD method and other typical approaches to numerical solutions of Maxwell's equations can be time consuming. However, the present technology provides an alternative that can considerably speed up the computation during optimization. Because Maxwell's equations are linear, the scattering geometry can be divided into a set of basis geometries. Each basis geometry can include the entire nanophotonic scattering structure, but with only a single pixel set to the height of that pixel in the original geometry, and the remaining pixels set to a height of zero. Optical fields for each of these basis geometries can be pre-computed, and then the fields can be summed appropriately to compute the fields in the entire structure. Because the optical fields for the basis geometries are pre-computed, calculation of the performance metric can involve a simple sum of the pre-computed optical fields without solving Maxwell's equations at each step. This can make the method much faster since individual contributions can be stored in a look-up table and simply retrieved at each step.

The steps of varying 130 the pixel height and calculating 140 the performance metric can be repeated 150 to increase the performance metric. If the performance metric would not be increased by varying the height of the pixel to any of the other at least two pixel height levels, then the height of the pixel can be retained without repeating these steps. Various algorithms can be used to increase the performance metric in this step. An algorithm can include considerations such as how many repetitions of the varying and calculating steps to perform, how far to vary the height of the pixel, and which direction to vary the height of the pixel. For example, in one embodiment a simple algorithm can involve varying the pixel height by one predefined height unit either up or down, then calculating the performance metric, and if the performance metric is increased then retaining the new height level and moving on to the next pixel, or if the performance metric is decreased then returning to the original height level. In another embodiment, this repetition step can include varying the height of the pixel to a pixel height level that increases the performance metric, followed by varying the height of the pixel again to another pixel height level that further increases the performance metric. Following this algorithm can allow the performance metric to be increased even more than if the pixel height had only been varied once. An algorithm can be designed to seek an optimum performance metric based on the height level of the pixel before moving on to the next pixel. In one specific embodiment, this step can include raising the pixel by one predefined height unit from an original height level to an upper height level, and then proceeding to the next pixel if the performance metric is increased, or if the performance metric is not increased, then lowering the pixel by two predefined height units to a lower height level and then proceeding to the next pixel if the performance metric is higher than at the original height level, or raising the pixel back to the original height level if the performance metric is highest at the original height level.

The steps of varying 130 the pixel height, calculating 140 the performance metric, and repeating 150 to increase the performance metric can be repeated 160 for each pixel within the array of discrete pixels until these steps have been performed for every pixel within the array of discrete pixels. Each time these steps are repeated for every pixel in the array, one complete iteration in the method has occurred. The order in which pixels are selected for performing these steps can affect the efficiency of the method. For instance, pixels can be selected randomly to achieve a more global search. Pixels can also be selected sequentially, going from one pixel to an adjacent pixel.

The steps of varying 130 the pixel height, calculating 140 the performance metric, repeating 150 to increase the performance metric, and repeating 160 for each pixel can be repeated until the performance metric reaches an optimized value. In one embodiment, the performance metric can be deemed to have reached an optimized value if an entire iteration is performed without changing any pixel heights. In another embodiment, the performance metric can be deemed to have reached an optimized value when the change in the performance metric between one iteration and the next falls below a threshold value.

Figure 3:
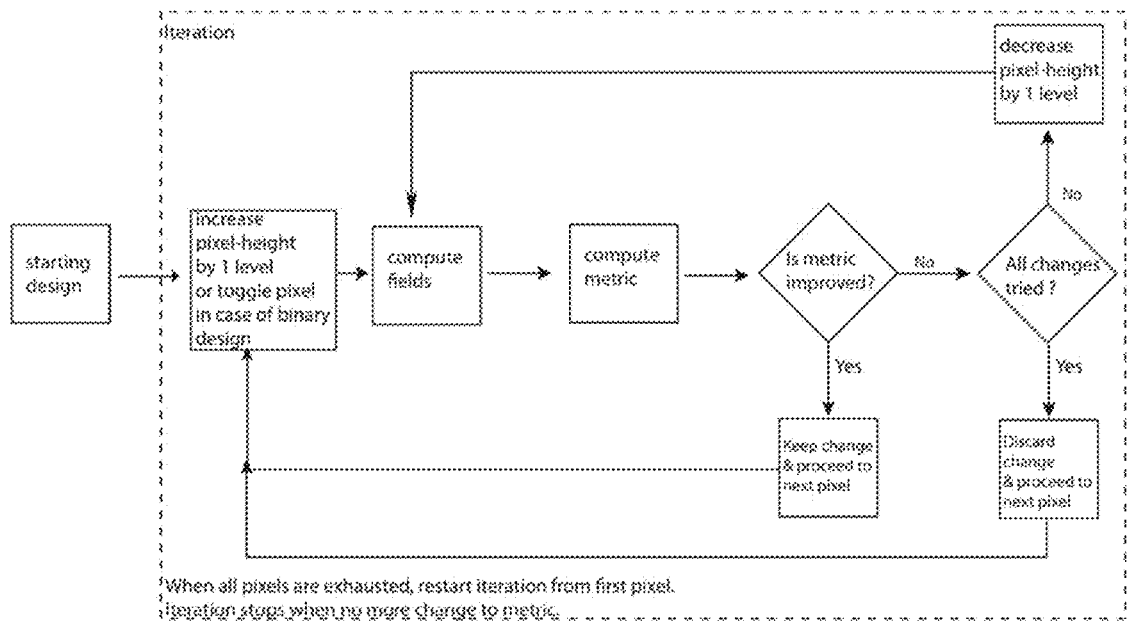
FIG. 3 is a flow diagram of a design method in accordance with an embodiment of the present technology.

In one particular embodiment, the method can be an Iterative Pixelated Perturbation Algorithm (IPPA). An IPPA method can be based on a direct nonlinear optimization method. FIG. 3 depicts a flow chart of an IPPA method 300. The iteration begins with a starting design, which can be generated by a variety of means as discussed above. In some embodiments, the starting design can be a random design. Any other starting design can also be used. The height of the first pixel is perturbed by increasing the height by a predefined unit-height. In the case of a binary design, the pixel is chosen to be present or absent. The appropriate optical fields in the region of interest (e.g., in the volume of the active layer) are computed. In nanophotonics, this is typically achieved by numerical solution of Maxwell's equations. One particular method of solving Maxwell's equations numerically is to use the finite-difference-time-domain (FDTD) method. Basis geometries can also be used to compute the optical fields, as explained above. The performance metric is then computed for the entire nanophotonic scattering structure. Typically, the performance metric is determined by the application of interest. In the case of light-trapping for photovoltaics, the performance metric can be the wavelength-averaged light absorption in the active layer or the current generated by light absorption within the active layer, for example. If the performance metric is improved from a previous iteration, then the perturbation is kept and steps of increasing, computing fields, computing the metric and determining improvement are repeated with the next pixel. If the consolidated metric is not improved, then those steps are repeated with the same pixel, but the pixel height is reduced by the unit-height. Finally, if both perturbations have not improved the metric, the perturbations are discarded and these steps are repeated with the next pixel. Once all pixels are considered, the next iteration begins with the first pixel again. The method stops when all the pixels are considered and there is no change in the metric.

A nanophotonic scattering structure in accordance with an embodiment of the present invention can be obtained by a process which can include establishing an initial design that has a back layer, an active layer, and an adjacent scattering layer. As shown in FIG. 2, a nanophotonic scattering structure 200 can have a back layer 240, an active layer 205 and an adjacent scattering layer 210. In some embodiments, the nanophotonic scattering structure can include a transparent cladding layer 245 disposed between the active layer 205 and the scattering layer 210. The scattering layer can have an array of discrete pixels 215 wherein each discrete pixel has a geometric profile and is variable between at least two pixel height levels 220. The process can further include identifying a performance metric for the nanophotonic scattering structure and varying a height 230 of a pixel from the array of discrete pixels among the at least two pixel height levels, said performance metric being a function of the height. The performance metric can be calculated for the nanophotonic scattering structure and the steps of varying the pixel height and calculating the performance metric can be repeated to increase the performance metric. If the performance metric would not be increased by varying the height of the pixel to any of the other at least two pixel height levels, then the height of the pixel can be retained without repeating these steps. The above steps can be repeated for each pixel within the array until the steps have been performed for every pixel within the array. The above steps can further be repeated until the performance metric reaches an optimized value.

In various embodiments of the nanophotonic scattering structure, the back layer can perform a variety of functions. In some embodiments, the back layer can include a back contact layer. In some such embodiments, a back contact layer can be used to conduct electrical current or signals produced in the active layer. In other embodiments, the back layer can include a reflective layer. Such a reflective layer can be used, for example, to reflect light back into the active layer and increase absorbance of light in the active layer. In still further embodiments, the back layer can include a polarization and spectrum splitting structure. The back layer can also include combinations of more than one of back contact layers, reflective layers, polarization and spectrum splitting structures, and other types of back layers.

A nanophotonic scattering structure in accordance with an embodiment of the present invention can include a back layer, an active layer disposed over the back layer, and a scattering layer disposed over the active layer. FIG. 2 depicts a nanophotonic scattering structure 200 with a back layer 240, and active layer 205, and a scattering layer 210 disposed over the active layer. The scattering structure can include an array of discrete pixels 215, wherein each discrete pixel has a geometric profile and a pixel height 230, and wherein the discrete pixels are arranged in an irregular, non-random pattern of pixel heights. The irregular, non-random pattern can be non-random because the pattern can be designed using a method for optimizing the design. In some embodiments, the pattern can be non-periodic. The pixel geometries provided are sub-wavelength (smaller than the wavelengths of interest). Thus, these structures are based upon near-field scattering rather than scalar diffraction.

Figure 4A:
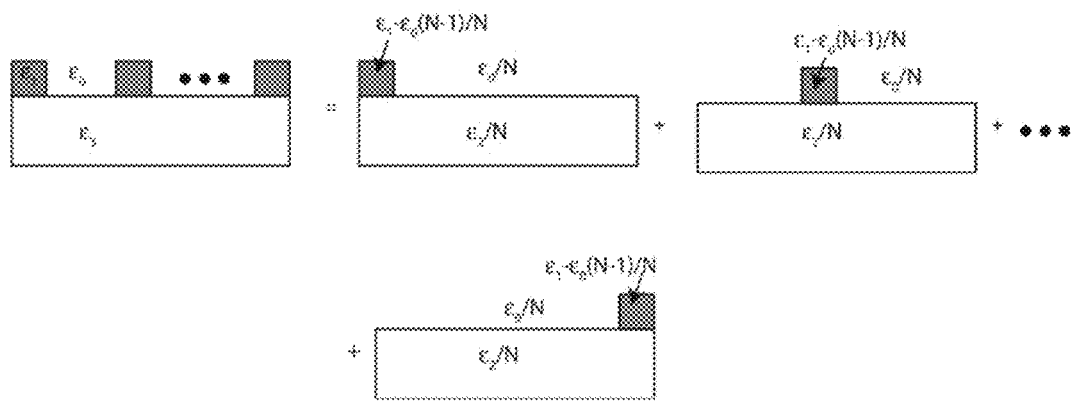
FIG. 4A illustrates linear superposition of basis geometries for fast field computation in the case of binary structures.
Figure 4B:
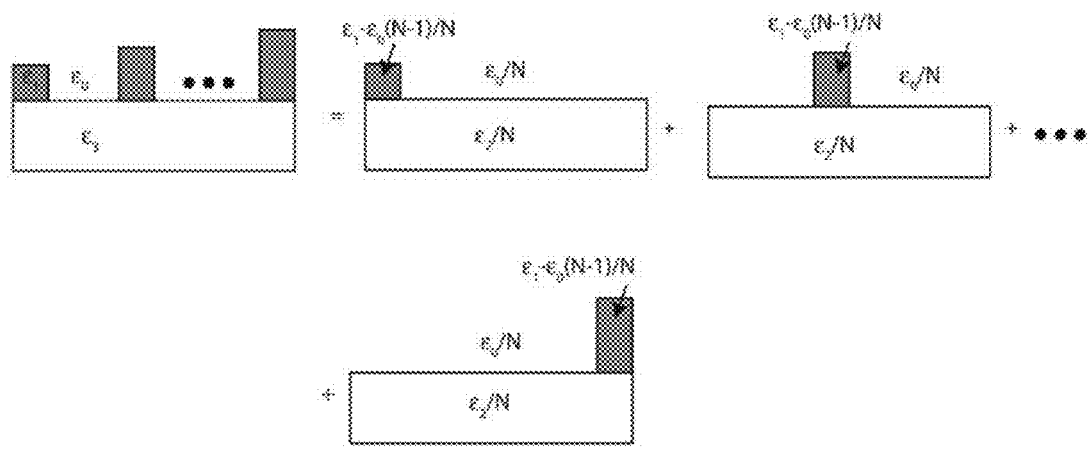
FIG. 4B illustrates linear superposition of basis geometries for fast field computation in the case of multi-level structures.

Two simple examples are shown in FIGS. 4A and 4B to illustrate the approach. FIG. 4A illustrates linear superposition of basis geometries for fast field computation in the case of binary structures. FIG. 4B illustrates such linear superposition in the case of multi-level structures. The total number of pixels on the left-hand side is N. In FIG. 4A, the binary-design on the left is divided into a sum of basis geometries. Each basis geometry in the sum is identical except for a lateral shift. In linear optics, Maxwell's equations are shift-invariant, which means that the fields for the basis geometries are also the same except for a lateral shift. In order to account for the constitutive equations, however, the dielectric permittivity of the basis geometries can be considered. The dielectric permittivity ($\in$) can be scaled such that when the geometries are all added, the resulting $\in$ is the same as the original design geometry. In this simple example, the $\in$ for each basis geometry is the $\in$ for the original geometry divided by the total number of pixels in the original geometry. The $\in$ for each structure is scaled in this manner. The optical fields for the basis geometries can be pre-computed for all values of N from 1 to the maximum value. The optical field for any arbitrary collection of pixels can then be quickly calculated as a simple sum of the pre-computed fields. The technique can be applied to both binary structures (FIG. 4A) as well as the multi-level structures (FIG. 4B). In the case of multi-level structures, fields for all allowed height-levels of the pixel can be pre-computed as well. Using this basis geometry technique can allow fast calculation of optical fields in the nanophotonic scattering structure. Also, the optical fields can be calculated in the real-space domain, as opposed to the spatial-frequency domain.

The performance metric can be easily calculated from the optical fields using whatever relationship defines the particular performance metric. Furthermore, the performance metric can be a combined performance metric that includes multiple individual metrics. For example, in some embodiments both a light intensity enhancement factor and a short circuit current density enhancement factor can be optimized. Both of these metrics can be summed to create a combined performance metric. Also, each metric can be multiplied by a weighting factor to adjust the relative importance of each metric to the combined performance metric. The weighting factors can be kept constant throughout the entire optimization process, so that each time the performance metric is calculated, the same weighting factors are used. Keeping the weighting factors constant in this way can help achieve a better optimum design with better tolerances.

Any boundary conditions can be used when calculating the performance metric. For example, the boundary conditions can be periodic if the nanophotonic scattering structure represents a single period of a device that will be fabricated with multiple of such periods. In other embodiments, the boundary conditions can be non-periodic, such as if an entire device is being designed using the method instead of only a single period. Whatever boundary conditions are chosen, the method can produce an optimized design for those conditions.

While the flowcharts presented for this technology may imply a specific order of execution, the order of execution can differ from what is illustrated. For example, the order of two or more blocks can be rearranged relative to the order shown. Further, two or more blocks shown in succession can be executed in parallel or with partial parallelization. In some configurations, one or more blocks shown in the flow chart can be omitted or skipped.

The methods described in this specification can be performed by modules. Various types of modules can be used in combination to perform the methods. For example, a module can be implemented as a hardware circuit comprising custom VLSI circuits or gate arrays, off-the-shelf semiconductors such as logic chips, transistors, or other discrete components. A module can also be implemented in programmable hardware devices such as field programmable gate arrays, programmable array logic, programmable logic devices or the like. Modules can also be implemented in software for execution by various types of processors. Nevertheless, the executables of an identified module need not be physically located together, but can comprise disparate instructions stored in different locations which comprise the module and achieve the stated purpose for the module when joined logically together.

The technology described here can also be stored on a computer readable storage medium or computer readable storage device that includes volatile and non-volatile, removable and non-removable media implemented with any technology for the storage of information such as computer readable instructions, data structures, program modules, or other data. Computer readable storage media include, but is not limited to, RAM (Random-Access Memory), ROM (Read-Only Memory), EEPROM (Electrically Erasable Programmable Read-Only Memory), flash memory or other memory technology, CD-ROM (Compact Disc, Read-Only Memory), DVD (Digital Versatile Discs) or other optical storage, magnetic cassettes, magnetic tapes, magnetic disk storage or other magnetic storage devices or any other computer storage medium which can be used to store the desired information and described technology.

The described features, structures, or characteristics can be combined in any suitable manner in one or more examples. In the preceding description numerous specific details were provided, such as examples of various configurations to provide a thorough understanding of examples of the described technology. One skilled in the relevant art will recognize, however, that the technology can be practiced without one or more of the specific details, or with other methods, components, devices, etc. In other instances, well-known structures or operations are not shown or described in detail to avoid obscuring aspects of the technology.

The foregoing detailed description describes the invention with reference to specific exemplary embodiments. However, it will be appreciated that various modifications and changes can be made without departing from the scope of the present invention as set forth in the appended claims. The detailed description and accompanying drawings are to be regarded as merely illustrative, rather than as restrictive, and all such modifications or changes, if any, are intended to fall within the scope of the present invention as described and set forth herein.

EXAMPLES

Example 1

Figure 5:
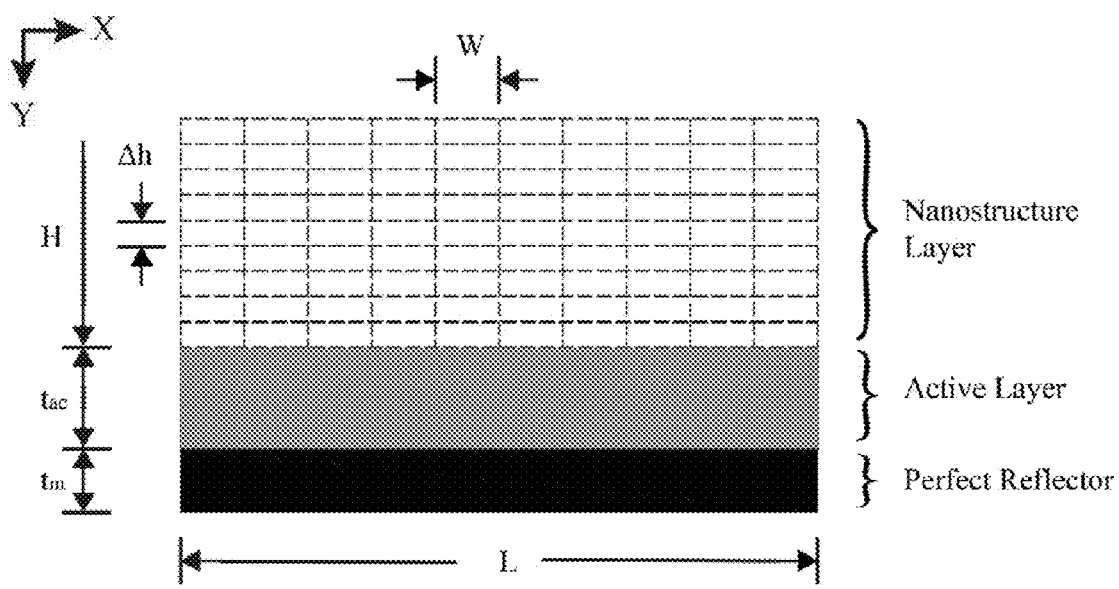
FIG. 5 is a schematic diagram of a geometry for light-trapping optimization in accordance with an embodiment of the present technology.

The geometry shown in FIG. 5 defines the various parameters used in a design process. In this example, a multi-level scattering structure is used where $\Delta h$ represents the smallest step-height in this structure. The other key geometric parameters are the active-layer thickness, $t_{ac}$, the reflector thickness $t_m$, the height of the scattering layer H, width of a pixel W, and length of the structure L. The boundary conditions in this example are periodic, with L being the length of one period. A one-dimensional scattering structure is initially considered for simplicity. The metric for optimization is the enhancement in short-circuit current density due to the presence of the scattering structure.

Two specific design examples are present, including the parameters listed below in Table 1. In design 1, the incident wavelength is 510 nm. In design 2, the incident wavelengths are 500 nm and 900 nm. In each case the incident angle was 0° (normal incidence).

TABLE 1

Parameters of the initial designs for light trapping

| | L (nm) | W (nm) | H (nm) | Δh (nm) | $t_{ac}$ (nm) | $t_m$ (nm) | λ (nm) |
|---|---|---|---|---|---|---|---|
| Design 1 | 400 | 40 | 200 | 10 | 10 | 10 | 510 |
| Design 2 | 800 | 40 | 400 | 10 | 10 | 10 | 500 & 900 |

Figure 6A:
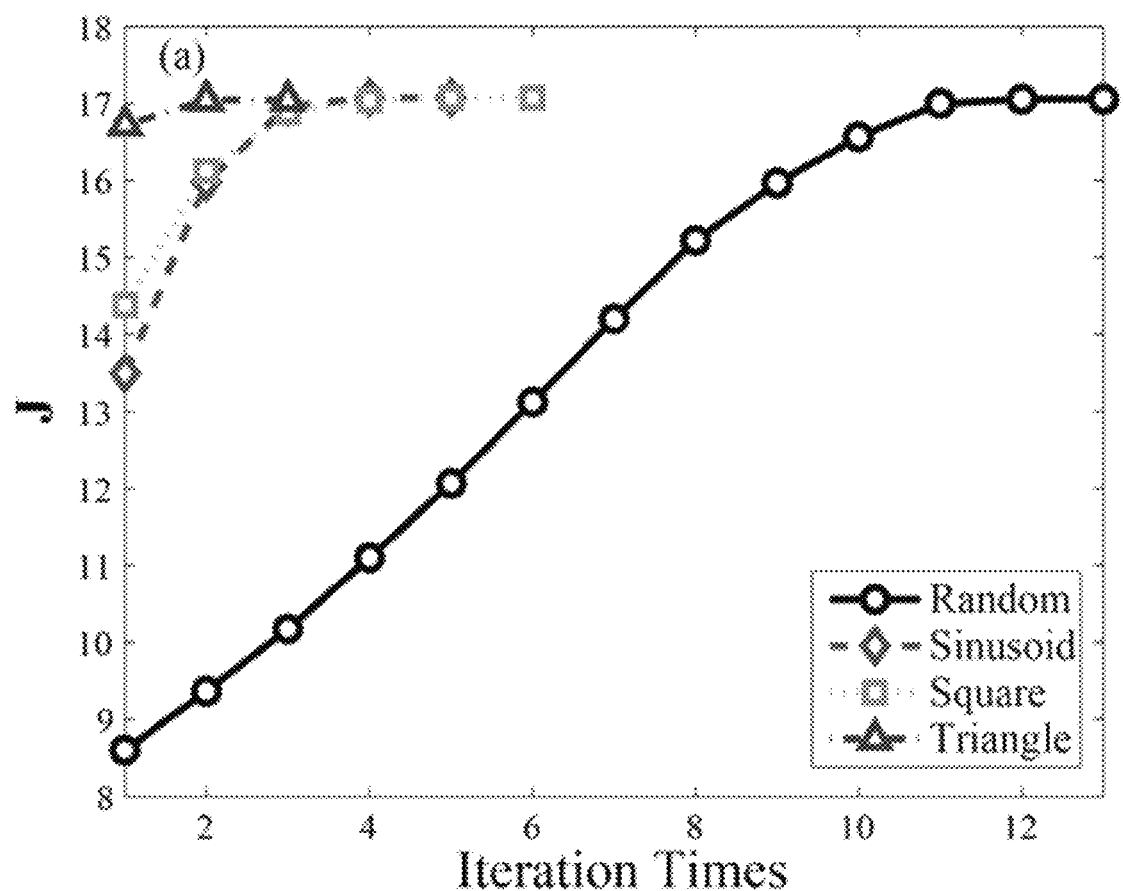
FIG. 6A is a graph of short-circuit current density enhancement factor as a function of number of iterations for several starting geometries of Example 1, design 1.

The optimization results of the first design are summarized and shown in FIG. 6A-6Q. Four initial designs were employed, including random structure (shown in FIG. 6B), sinusoid-modulated grating (FIG. 6F), square-modulated grating (FIG. 6J), and triangle-modulated grating (FIG. 6N). Regular geometries provide much higher initial enhancement than random structure. However, after several iterations of optimization, the metric improves and converges to a certain value. FIG. 6A is a graph with the short-circuit current density enhancement factor J on the y-axis and the number of iterations performed on the x-axis. According to FIG. 6A, the enhancement factor reaches a peak of ~17 after 13 iterations for the random initial design. Two major effects account for the light absorption enhancement. One is that the silica layer with a low refractive index acts as an anti-reflection coating between air and silicon with a high refractive index. The other is the presence of guided-mode resonances. Because of the continuous boundary condition, the strong resonances can easily couple into the active layer, leading to increased absorption and finally short-circuit-current-density boost. Another interesting observation is that although initiated from different designs, all four optimizations tend to converge to one same design—a slightly asymmetric triangle-modulated grating. The optimized results from each of the four initial designs are shown in FIG. 6C for the random initial design, FIG. 6G for the sinusoid-modulated grating, FIG. 6K for the square-modulated grating, and FIG. 6O for the triangle-modulated grating. This indicates that the optimization process is capable of searching for a globally optimal design, and that a periodic asymmetric triangle grating is an excellent candidate for nanophotonic light trapping, not only for discrete levels but also for continuous profiles. The time-averaged TM mode fields (Ex component) of 510 nm wavelength are shown for each of the four designs in FIGS. 6D, 6H, 6L and 6P, and the time-averaged TE mode fields (Ez component) are shown in FIGS. 6E, 6I, 6M and 6Q. The corresponding fields within the active layer are displayed underneath each figure.

Figure 7A:
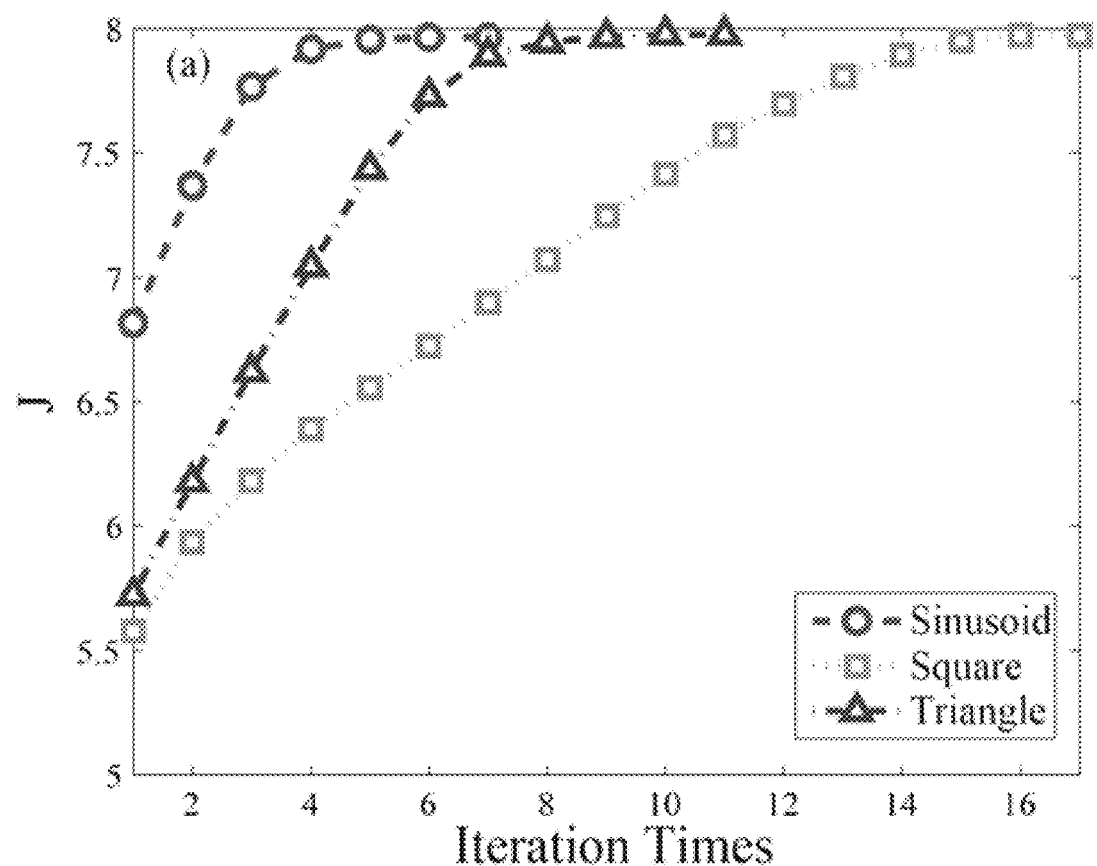
FIG. 7A is a graph of short-circuit-current-density enhancement factor J versus iteration number of Example 1, design 2.

In similar manner, FIG. 7A-7P summarizes the optimization results of Design 2 for nanophotonic light trapping. The initial designs for the sinusoid grating, square grating, and triangle grating were used again. Since the initial designs are the same as in Design 1, the designs are not included again in the summaries. FIG. 7A illustrates a short-circuit-current-density enhancement factor J versus iteration number. For the sinusoid grating, FIG. 7B represents the optimized design, FIG. 7C represents the TM mode field for λ=500 nm, FIG. 7D represents the TE mode field for λ=500 nm, FIG. 7E represents the TM mode field for λ=900 nm, and FIG. 7F represents the TE mode field for λ=900 nm. For the square grating, FIG. 7G represents the optimized design, FIG. 7H represents the TM mode field for λ=500 nm, FIG. 7I represents the TE mode field for λ=500 nm, FIG. 7J represents the TM mode field for λ=900 nm, and FIG. 7K represents the TE mode field for λ=900 nm. For the triangle grating, FIG. 7L represents the optimized design, FIG. 7M represents the TM mode field for λ=500 nm, FIG. 7N represents the TE mode field for λ=500 nm, FIG. 7O represents the TM mode field for λ=900 nm, and FIG. 7P represents the TE mode field for λ=900 nm.

Example 2

Figure 8A:
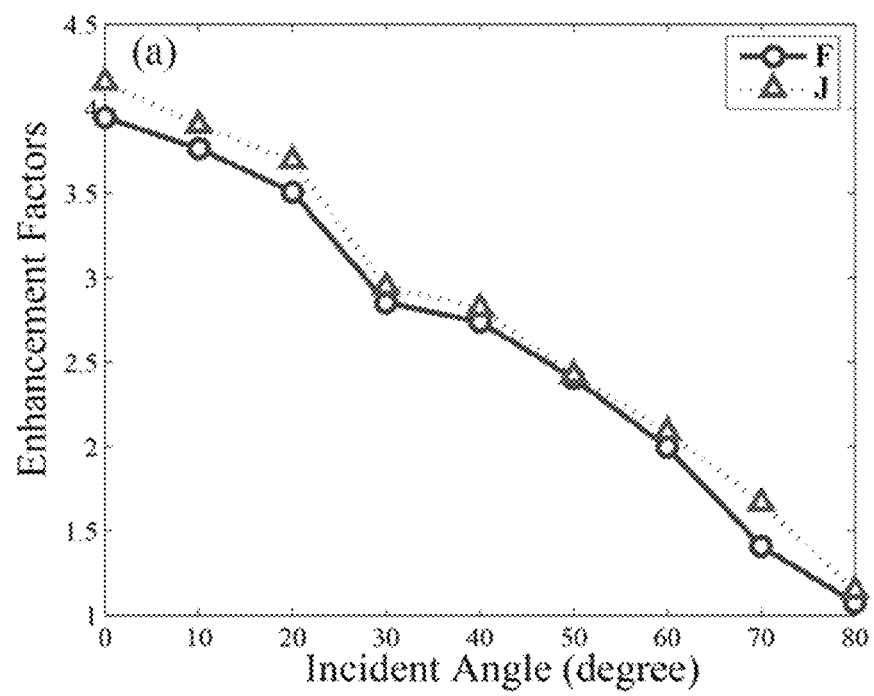
FIG. 8A is a graph of spectrally-cumulative enhancement factors, J and F, versus incident angle for Design 1.
Figure 8B:
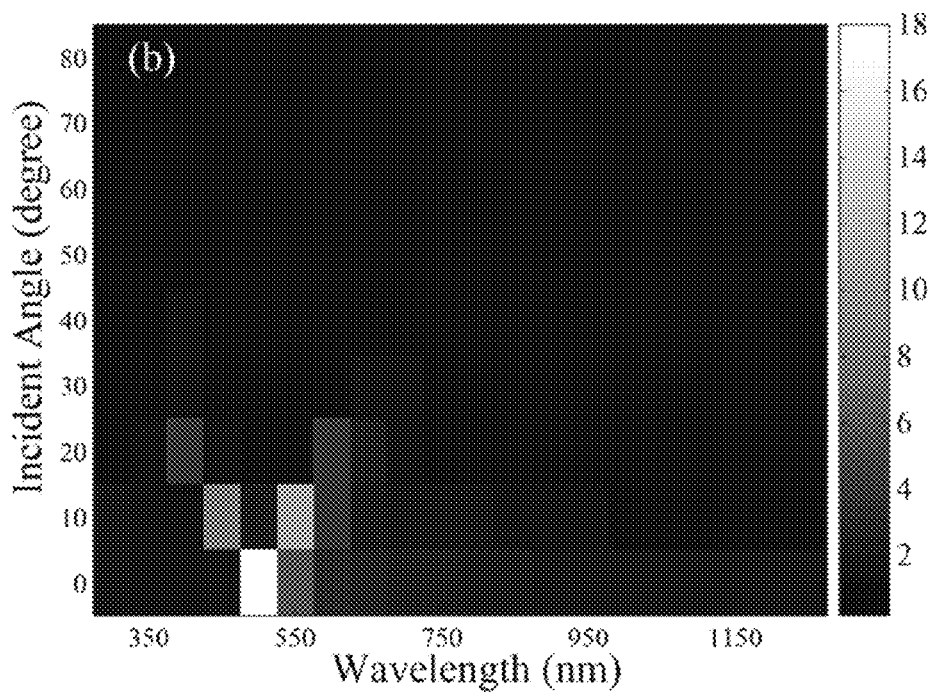
FIG. 8B illustrates spectral enhancement factor (F) as a function of incident angle and wavelength for Design 1.
Figure 9A:
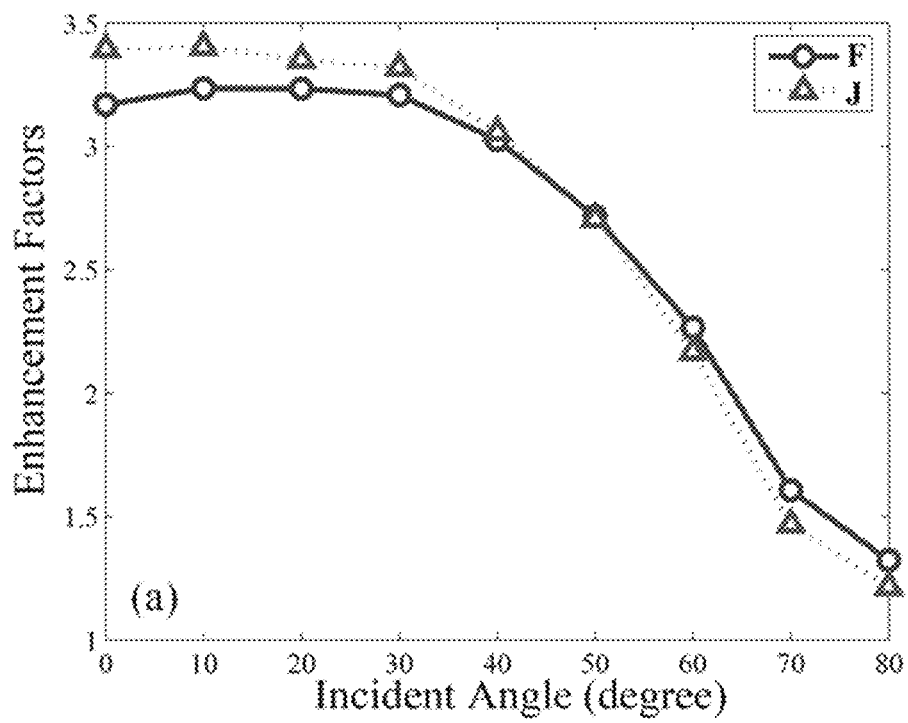
FIG. 9A is a graph of spectrally-cumulative enhancement factors, J and F, versus incident angle for Design 2.
Figure 9B:
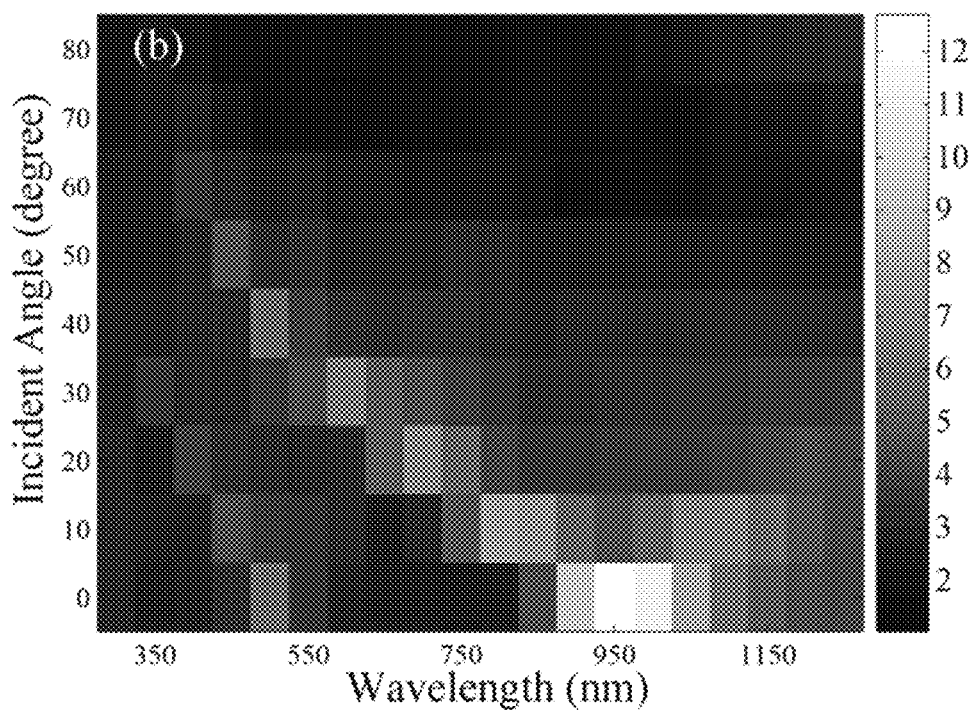
FIG. 9B illustrates spectral enhancement factor (F) as a function of incident angle and wavelength for Design 2.

Since in some circumstances the sun moves relative to a photovoltaic device, a scattering structure can be designed to provide enhancement for a broad range of incident angles. Such design parameters can be relatively easily incorporated into the performance metric. In FIG. 8A-9B, the angular response of the optimized designs in Designs 1 and 2, respectively, are shown. Specifically, FIG. 8A illustrates the spectrally-cumulative enhancement factors J and F, defined below, vs. incident angle and FIG. 8B illustrates a spectral enhancement factor (F) in terms of different incident angles and wavelengths. Similarly, FIG. 9A illustrates the spectrally-cumulative enhancement factors J and F vs. incident angle, and FIG. 9B illustrates the spectral enhancement factor (F) in terms of different incident angles and wavelengths.

Although one or two wavelengths were used during the optimization of the design, the broadband AM1.5 spectrum (350 nm to 1250 nm) was used to evaluate the angular response. The light intensity enhancement factor F(θ) and short circuit current density enhancement factor J(θ) in FIG. 8B and FIG. 9A, and the spectral enhancement factor F(λ, θ) and J(λ, θ) in FIG. 8B and FIG. 9B are defined as:

$$F(\lambda, \theta) = \frac{\frac{1}{\Lambda}\iint\limits_{active} I(x, y, \lambda, \theta)dxdy}{\frac{1}{\Lambda_{ref}}\iint\limits_{active} I_{ref}(x, y, \lambda, \theta)dxdy} \quad (1.1)$$

$$F(\theta) = \frac{\frac{1}{\Lambda}\int_\lambda \left(\iint\limits_{active} I(x, y, \lambda, \theta)dxdy\right)d\lambda}{\frac{1}{\Lambda_{ref}}\int_\lambda \left(\iint\limits_{active} I_{ref}(x, y, \lambda, \theta)dxdy\right)d\lambda} \quad (1.2)$$

$$J(\lambda, \theta) = \frac{\frac{q}{t_a\Lambda}\iint\limits_{active} \frac{I(x, y, \lambda, \theta)}{hc/\lambda} IQE(\lambda)dxdy}{\frac{q}{t_a\Lambda_{ref}}\iint\limits_{active} \frac{I_{ref}(x, y, \lambda, \theta)}{hc/\lambda} IQE(\lambda)dxdy} \quad (1.3)$$

$$J(\theta) = \frac{\frac{q}{t_a\Lambda}\int_\lambda \left(\iint\limits_{active} \frac{I(x, y, \lambda, \theta)}{hc/\lambda} \cdot IQE(\lambda)dxdy\right)d\lambda}{\frac{q}{t_a\Lambda_{ref}}\int_\lambda \left(\iint\limits_{active} \frac{I_{ref}(x, y, \lambda, \theta)}{hc/\lambda} \cdot IQE(\lambda)dxdy\right)d\lambda} \quad (1.4)$$

(4)

where I(x,y,λ,θ) is the light intensity in the active region at wavelength λ and location (x,y) and angle of incidence θ. These equations apply to a two-dimensional configuration but can be readily extended to three dimensions by introduction of z and volumetric considerations.

The angular response of design 1 (FIG. 8A) with period of 400 nm shows high enhancement at normal incident and drops gradually at oblique incidence. However, design 2 (FIG. 9A) with period of 800 nm represents an elevated angular response. At normal incidence, the spectrally-cumulative enhancement factor J reaches over 3.4, lower than that of design 1, but J remains relatively high (over 3.0) within 40 degrees incident angle, and then reduces to ~1.2 at 80 degrees incident angle. Thus, design 2 with much larger period provides more isotropic, more flattened and better angular response. This can be explained through the spectrum analysis in FIG. 8B and FIG. 9B. More chances for guided mode resonances in nanostructures with larger period appear at off-normal incidence. Although the resonance strengths are weak, the overall effects ultimately lead to good enhancements.

Example 3

For a binary design, two discrete levels are applied to each pixel—0 and $H_{max}$—which can be useful for simpler and inexpensive fabrication. Thus the optimization is a process of searching for the optimal binary sequence. Two designs are considered, and their parameters are listed in Table 2.

TABLE 2

Parameters of the initial designs for light trapping

| | L (nm) | W (nm) | $H_{max}$ (nm) | Δh (nm) | $t_{ac}$ (nm) | $t_m$ (nm) | λ (nm) |
|---|---|---|---|---|---|---|---|
| Design 3 | 400 | 20 | 100 | 100 | 10 | 10 | 510 |
| Design 4 | 400 | 20 | 200 | 200 | 10 | 10 | 510 |

Figure 10A:
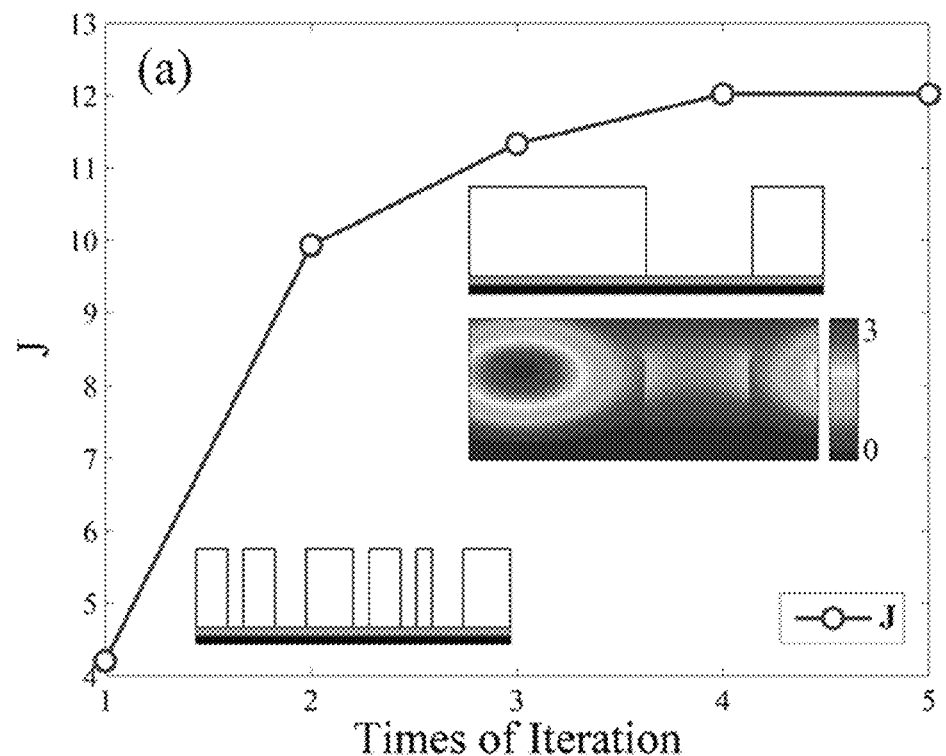
FIG. 10A is a graph of enhancement factor as a function of iterations including a random design, the optimized design, and time-averaged field of Example 3, design 3.
Figure 10B:
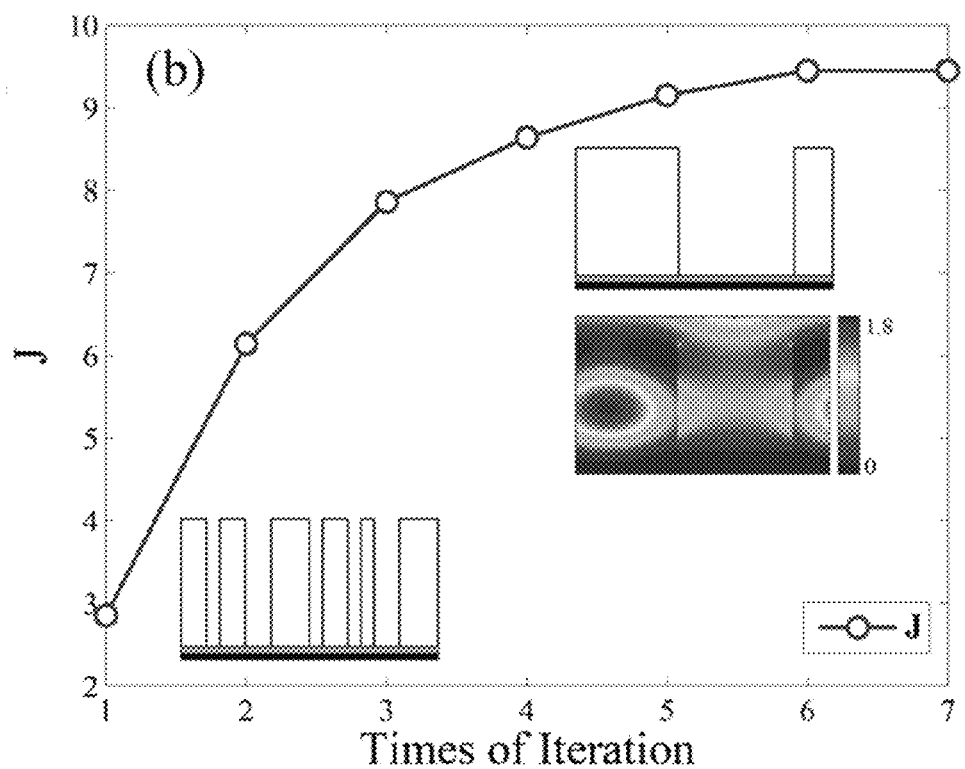
FIG. 10B is a graph of enhancement factor as a function of iterations including a random design, the optimized design, and time-averaged field of Example 3, design 4.

The results for the two designs are plotted in FIG. 10A (design 3) and FIG. 10B (design 4), respectively. Among the inset figures, the bottom insets show the initial random designs, the top insets show the optimized designs, and the middle insets show the time-averaged field within the entire structure. The short-circuit-current-density enhancement factor J reaches 12 and 9.5, respectively. It can be observed that initial designs with several obvious peaks and valleys converge to uniform regular square gratings.

Example 4

The following discussion represents optimization results for two dimensional (2D) binary surface nano structures for light trapping in photovoltaics. For simplicity, two height levels (binary) were used. However, the technology can be applied to any other number of levels as well (e.g. three to six or more depending on the device). Two designs are considered, the parameters thereof being listed below in Table 3. The boundary conditions of the design are periodic in both the x and y directions, where Lx is the length of the period in the x direction, Ly is the length of the period in the y direction, Wx is the pixel width in the x direction, and Wy is the pixel width in the y direction.

TABLE 3

Parameters of the initial designs for light trapping

| | Lx (nm) | Ly (nm) | Wx (nm) | Wy (nm) | H (nm) | $t_{ac}$ (nm) | $t_m$ (nm) | λ (nm) |
|---|---|---|---|---|---|---|---|---|
| Design 5 | 400 | 400 | 50 | 50 | 150 | 60 | 60 | 500 |
| Design 6 | 400 | 400 | 50 | 50 | 250 | 60 | 60 | 500 |

Figure 11:
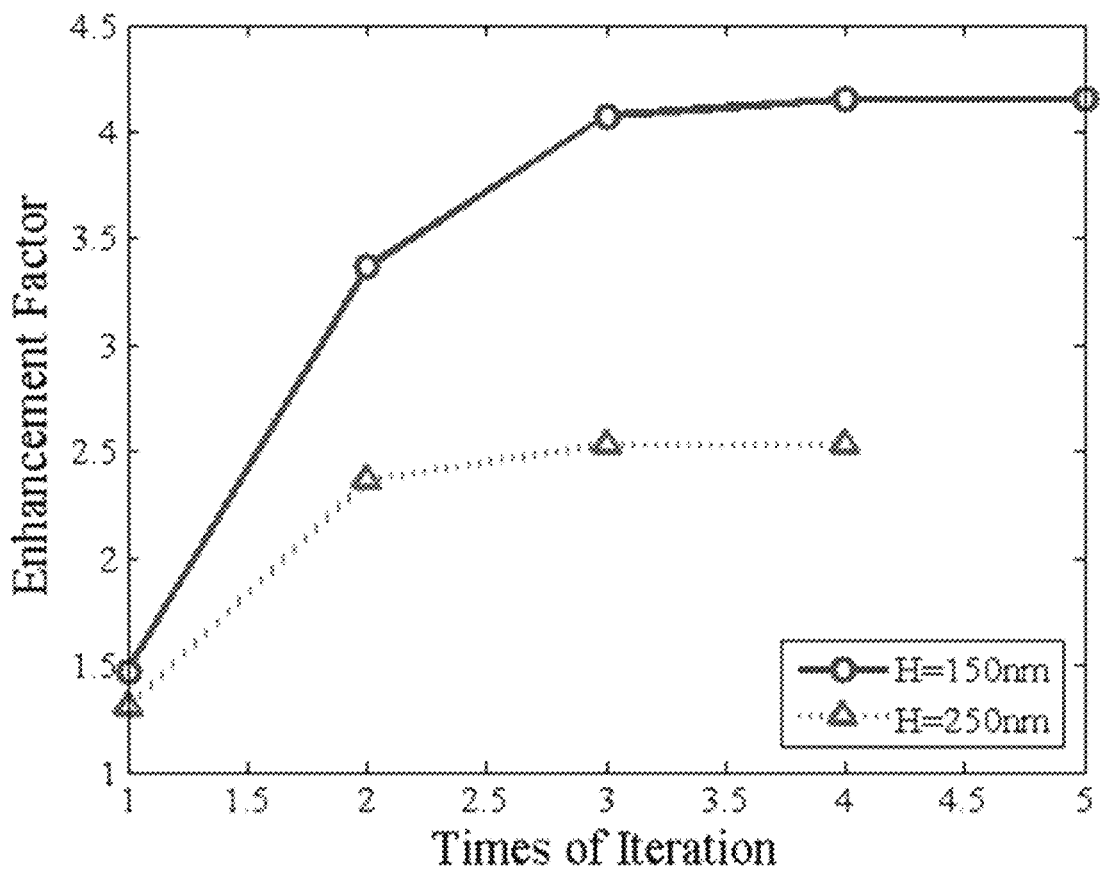
FIG. 11 is a graph of enhancement factor as a function of iterations for Example 4, design 5 (150 nm) and design 6 (250 nm) for a two-dimensional design.
Figure 12A:
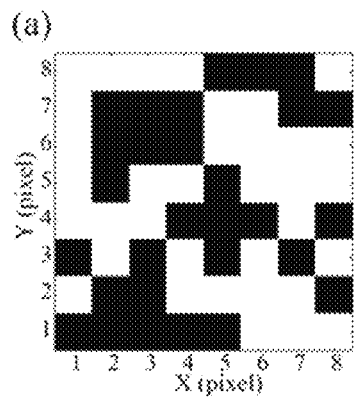
FIG. 12A is a random initial 2D design for design 5.
Figure 12B:
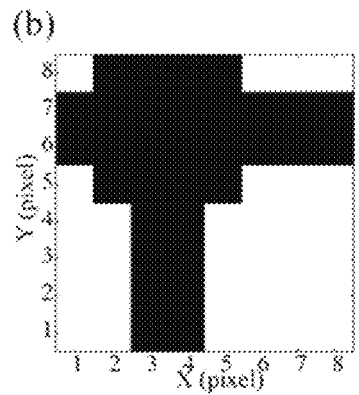
FIG. 12B is an optimized design based on the random design of FIG. 12A.
Figure 12C:
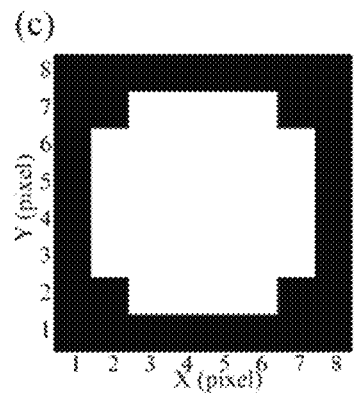
FIG. 12C is a shifted optimized design based on the random design of FIG. 12A.
Figure 12D:
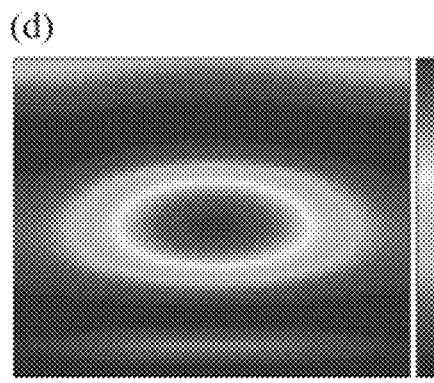
FIG. 12D is the TM mode field at 200 nm for the optimized design.
Figure 12E:
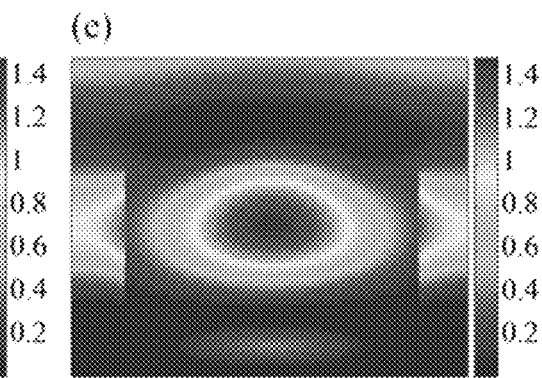
FIG. 12E is the TE mode field at 200 nm for the optimized design.
Figure 12F:
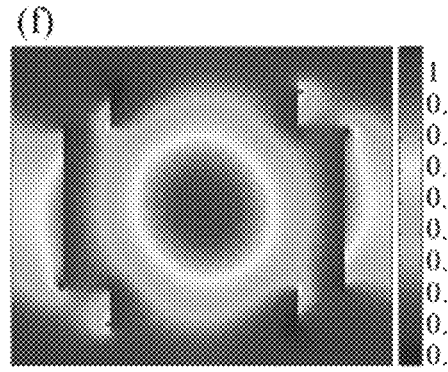
FIG. 12F is the TM mode field at 350 nm for the optimized design.
Figure 12G:
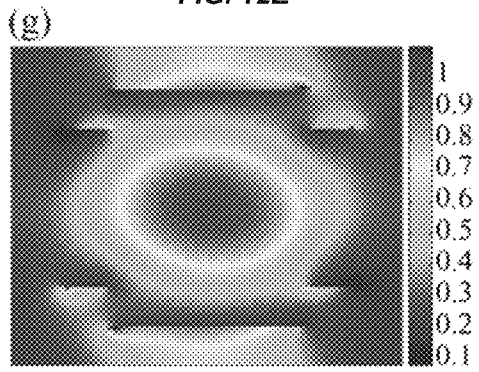
FIG. 12G is the TE mode field at 350 nm for the optimized design.
Figure 13A:
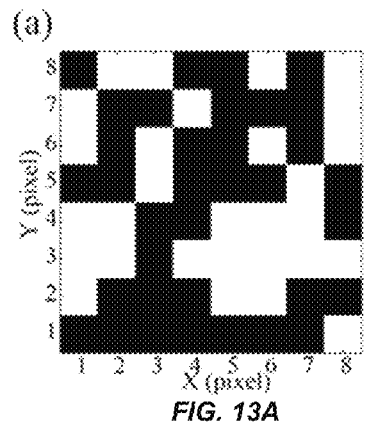
FIG. 13A is a random initial 2D design for design 6.
Figure 13B:
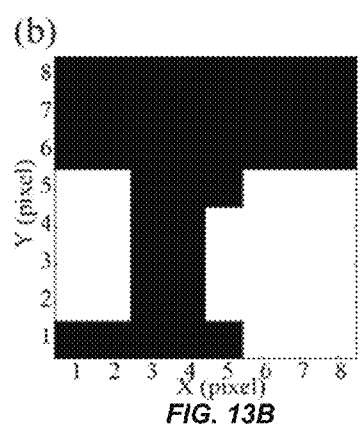
FIG. 13B is an optimized design based on the random design of FIG. 13A.
Figure 13C:
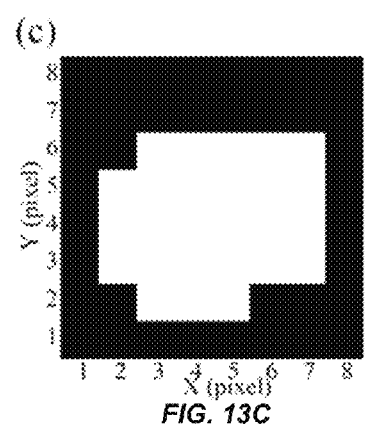
FIG. 13C is a shifted optimized design based on the random design of FIG. 13A.
Figure 13D:
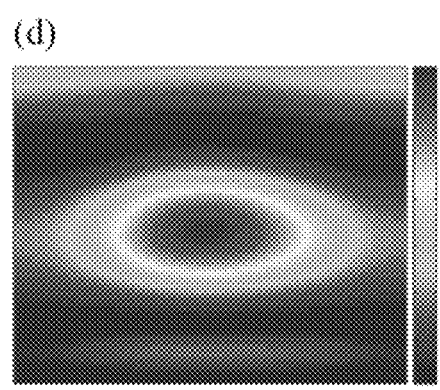
FIG. 13D is the TM mode field at 200 nm for the optimized design.
Figure 13E:
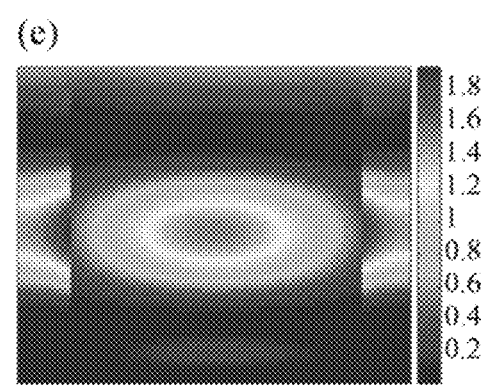
FIG. 13E is the TE mode field at 200 nm for the optimized design.
Figure 13F:
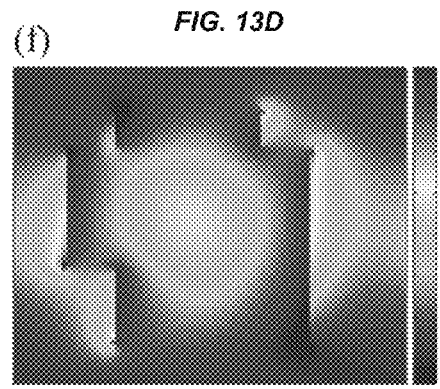
FIG. 13F is the TM mode field at 350 nm for the optimized design.
Figure 13G:
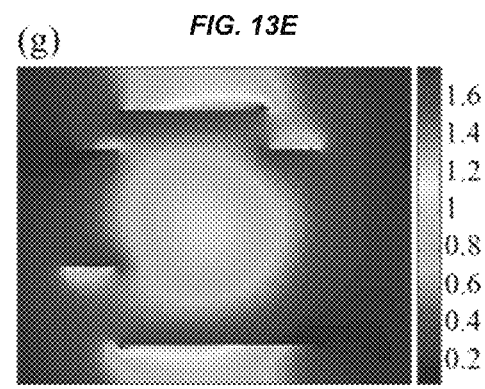
FIG. 13G is the TE mode field at 350 nm for the optimized design.

The optimization results for designs 5 and 6 are summarized in FIG. 11. The enhancement factors (i.e. J) increase to over 4 for design 5, and over 3 for the design 6. In addition, even higher enhancements can be achieved if given more degrees of design freedom, including grating periods in both directions, grating layer heights and structure profiles.

In FIG. 12A-13G, more details about the optimizations are shown, including the initial random design, the optimized design and the shifted optimized design, together with the light field of the TM and TE modes as different cross-sections of x direction and y direction. Specifically, FIG. 12A-G and FIG. 13A-G illustrate results for designs 5 and 6 respectively in terms of (a) initial design, (b) optimized design, (c) shifted optimized design (periodic boundaries are assumed), (d) TM mode at x=200 nm, (e) TE mode at x=200 nm, (f) TM mode at y=350 nm, and (g) TE mode at y=350 nm.

Example 5

The present technology can use the design methods described to achieve effective spectrum splitting via exploiting dielectric surface nanostructures. Spectrum splitting finds numerous applications ranging from scientific experiments to industrial facilities. One particular application is in photovoltaics. If sunlight were separated into separate bands and if the bands were absorbed by optimal solar cells, then overall light-to-electricity conversion efficiency could be much higher than current efficiencies. This example is analogous to tandem solar cells, which have demonstrated efficiencies of over 40%. Lateral separation of the cells avoids many of the problems associated with tandem cells.

Figure 14:
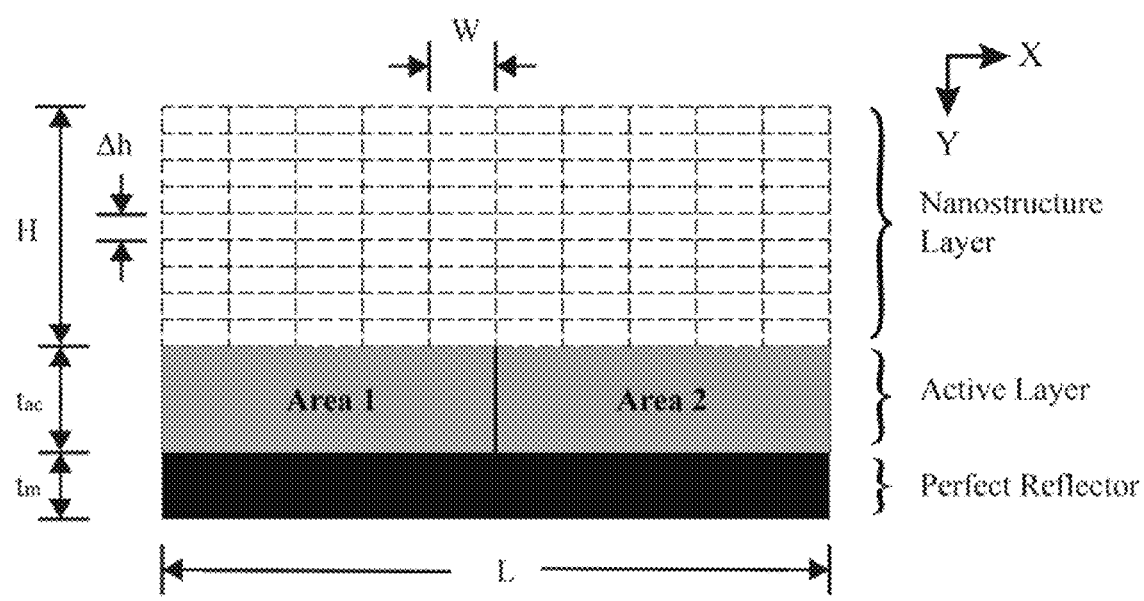
FIG. 14 is a schematic diagram of a geometry for spectrum splitting and polarization splitting in accordance with an embodiment of the present technology.
Figure 19A:
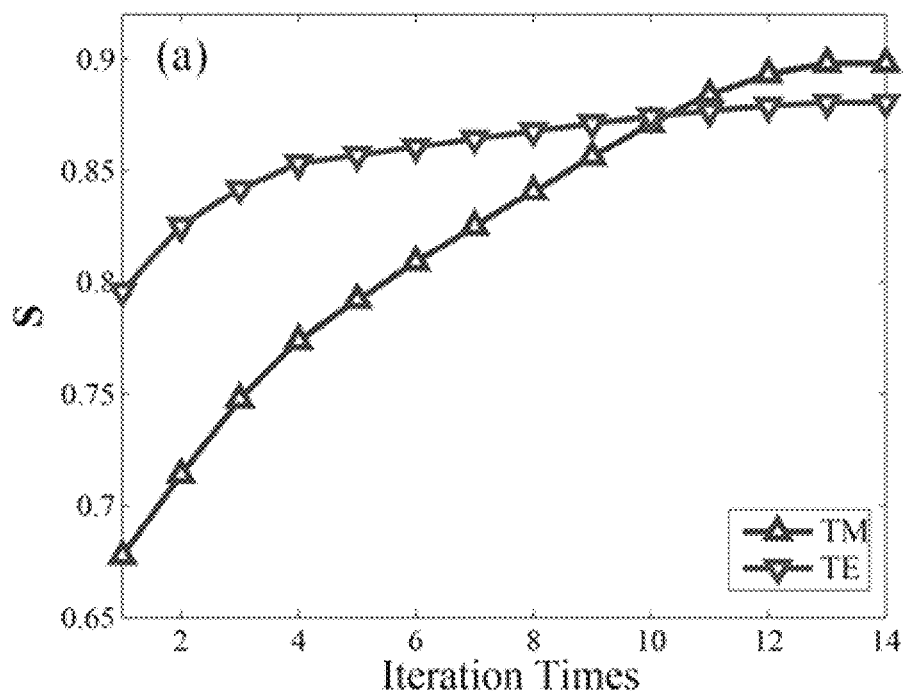
FIG. 19A is a graph of polarization-splitting factor versus number of iterations for Example 6, design 11.
Figure 19B:
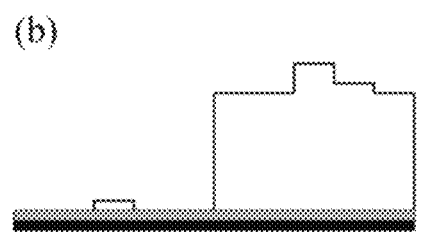
FIG. 19B is an optimized design for design 11.
Figure 19C:
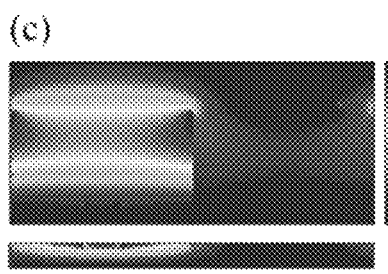
FIG. 19C is a time-averaged field of the TM mode for design 11.
Figure 19D:
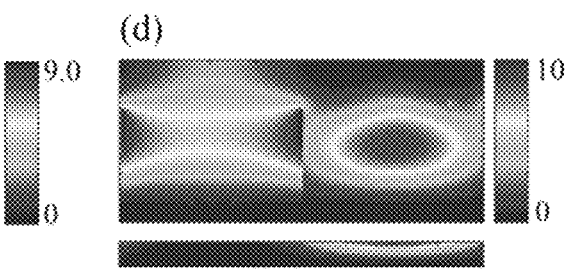
FIG. 19D is a time-averaged field of the TE mode for design 11.

An embodiment of the basic structure considered for spectrum splitting and polarization splitting is illustrated in FIG. 14. FIG. 14 is a basic example for purposes of simplicity in explanation, but the present technology more broadly enables various alternatives to this geometry including binary and 2D structures or more than 2 spectral bands, for example. The active layer is divided into two regions including Area 1 (left) and Area 2 (right). Incident solar light of AM1.5 spectrum can be split into two ranges, which are concentrated onto each area, respectively. For a practical photovoltaic architecture, two distinct kinds of solar cells can fit into each area to match the corresponding spectrum ranges. For simplicity here, crystalline silicon is considered as the active material for both regions. Different from other spectrum splitting schemes, such as chromatic dispersion and diffractive optics, the present technology can utilize near-field optics, since the distance between the targeted area and the nanostructure is on the nanometer scale, which allows for a very compact design.

The performance metric can be modified in this example. The short-circuit-current-density enhancement factor (J) and the spectrum-splitting factors (5) are defined below. In these equations, j(x, y, λ) stands for the short circuit current density at coordinate point (x, y) for wavelength λ.

$$S_{\lambda 1} = \frac{\int_{\lambda_1^{min}}^{\lambda_1^{max}} d\lambda \cdot \iint_{Area1} j(x, y, \lambda) \cdot dxdy}{\int_{\lambda_1^{min}}^{\lambda_1^{max}} d\lambda \cdot \iint_{Active} j(x, y, \lambda) \cdot dxdy} \quad (1.5)$$

$$S_{\lambda 2} = \frac{\int_{\lambda_2^{min}}^{\lambda_2^{max}} d\lambda \cdot \iint_{Area2} j(x, y, \lambda) \cdot dxdy}{\int_{\lambda_2^{min}}^{\lambda_2^{max}} d\lambda \cdot \iint_{Active} j(x, y, \lambda) \cdot dxdy} \quad (1.6)$$

-continued $$J = \frac{\left(\int_{\lambda_1^{min}}^{\lambda_1^{max}} d\lambda \cdot \iint_{Area1} j(x, y, \lambda) \cdot dxdy\right) + \left(\int_{\lambda_2^{min}}^{\lambda_2^{max}} d\lambda \cdot \iint_{Area2} j(x, y, \lambda) \cdot dxdy\right)}{\left(\int_{\lambda_1^{min}}^{\lambda_1^{max}} d\lambda \cdot \iint_{Area1} j_{ref}(x, y, \lambda) \cdot dxdy\right) + \left(\int_{\lambda_2^{min}}^{\lambda_2^{max}} d\lambda \cdot \iint_{Area2} j_{ref}(x, y, \lambda) \cdot dxdy\right)} \quad (1.7)$$

For simple demonstration, two design examples will be described, and one wavelength and one polarization state is considered in one spectrum range so as to accelerate the optimization process. The parameters are listed below in Table 4.

TABLE 4

Parameters of the initial designs for spectrum splitting

| | Geometry | L (nm) | W (nm) | H (nm) | Δh (nm) | $t_{ac}$ (nm) | $t_m$ (nm) | $\lambda_1$ (nm) | $\lambda_2$ (nm) | Polarization |
|---|---|---|---|---|---|---|---|---|---|---|
| Design 7 | Square | 400 | 40 | 240 | 10 | 10 | 10 | 450 | 550 | TM mode |
| Design 8 | Square | 600 | 40 | 320 | 10 | 10 | 10 | 400 | 600 | TE mode |

FIG. 15A-E and FIG. 16A-E illustrate optimization results of designs 7 and 8 respectively for spectrum splitting, where (a) represents spectrum-splitting factors vs. iteration number, (b) represents short-circuit-current-density enhancement factor vs. iteration number, (c) represents optimized design, (d) represents the time-averaged field at λ=450 nm, and (e) represents the time-averaged field at λ=550 nm. Both spectrum-splitting factors and enhancement factors are improved, indicating that the light fields of different wavelengths are more distinctly separated in the absorbing layer and the short circuit current is strongly enhanced at the same time. Spectrum separation is also observed from the light field within the active regions. The light fields in the active layer are shown at the bottom of (d) and (e). As seen by comparing the bottom portions of FIG. 15D with FIG. 15E and FIG. 16D with FIG. 16E, the separation in the active layer is apparent. For design 7, splitting factors S of 450 nn and 550 nm wavelength are optimized to 0.81 and 0.79, respectively, and J arrives at over 8.7. Similarly, S of design 8 reaches 0.88 for $\lambda_1$=400 nm and 0.56 for $\lambda_2$=600 nm, and J is 4.89 after optimization.

Example 6

Besides spectrum splitting, the splitting of polarization state can be valuable in many applications. Conventionally, specially coated prisms or special birefringent material or subwavelength metallic gratings are utilized as polarization-splitting elements. Most of these approaches are expensive and typically have poor polarization separation especially over a range of wavelengths. Nanophotonics can avoid such problems and allow for many important applications in modern communication systems and display technologies, such as liquid-crystal displays (LCD) and 3D displays, for example.

The nanophotonic structure in this example is the same structure depicted in FIG. 14. In this case, new performance metrics are the polarization-splitting factors as follows:

$$S^{TM} = \frac{\int_{\lambda_{min}}^{\lambda_{max}} d\lambda \cdot \iint_{Area1} I^{TM}(x, y, \lambda) \cdot dxdy}{\int_{\lambda_{min}}^{\lambda_{max}} d\lambda \cdot \iint_{Active} I^{TM}(x, y, \lambda) \cdot dxdy} \quad (1.8)$$

$$S^{TE} = \frac{\int_{\lambda_{min}}^{\lambda_{max}} d\lambda \cdot \iint_{Area2} I^{TE}(x, y, \lambda) \cdot dxdy}{\int_{\lambda_{min}}^{\lambda_{max}} d\lambda \cdot \iint_{Active} I^{TE}(x, y, \lambda) \cdot dxdy} \quad (1.9)$$

In this example, the left area is designated for TM mode and the right area for TE mode. $I^{TM}(x, y, \lambda)$ and $I^{TE}(x, y, \lambda)$ represent the field intensity of TM mode and TE mode, respectively. The nanostructure layer is made of fused silica and the goal region is made of crystalline silicon. The parameters of four designs are included in Table 5 below.

TABLE 5

Parameters of the initial designs for polarization splitting

| | Geometry | L (nm) | W (nm) | H (nm) | Δh (nm) | $t_{ac}$ (nm) | $t_m$ (nm) | λ (nm) |
|---|---|---|---|---|---|---|---|---|
| Design 9 | Sinusoid | 400 | 40 | 240 | 10 | 10 | 10 | 450 |
| Design 10 | Sinusoid | 600 | 40 | 320 | 10 | 10 | 10 | 650 |
| Design 11 | Square | 400 | 40 | 240 | 10 | 10 | 10 | 450 |
| Design 12 | Square | 600 | 40 | 320 | 10 | 10 | 10 | 650 |

The optimization results are summarized in FIG. 17A-D, FIG. 20A-D, FIG. 21A-D and FIG. 22A-D, corresponding to the four designs, where in each figure set (a) represents polarization-splitting factors vs. iteration number, (b) represents the optimized design, (c) represents the time-averaged field of the TM mode, and (d) represents the time-averaged field of the TE mode. The splitting factors are significantly increased as plotted in FIG. 17A, FIG. 18A, FIG. 19A and FIG. 20A. S of both the TM mode and the TE mode for all the designs rises up to over 0.8. For design 10, $S^{TE}$=0.96 and $S^{TM}$=0.86, and for design 11, $S^{TE}$=0.88 and $S^{TM}$=0.90. FIG. 17B, FIG. 18B, FIG. 19B and FIG. 20B show the optimized profiles, and the time-averaged field of the TM mode and the TE mode in the entire cell. The fields in the goal areas are drawn as well, in which obvious splitting can be observed. These examples demonstrate that the design method can be used to very efficiently separate polarizations. This technology can be incorporated into any number of devices that can utilize these split polarizations accordingly.

Example 7

Figure 21:
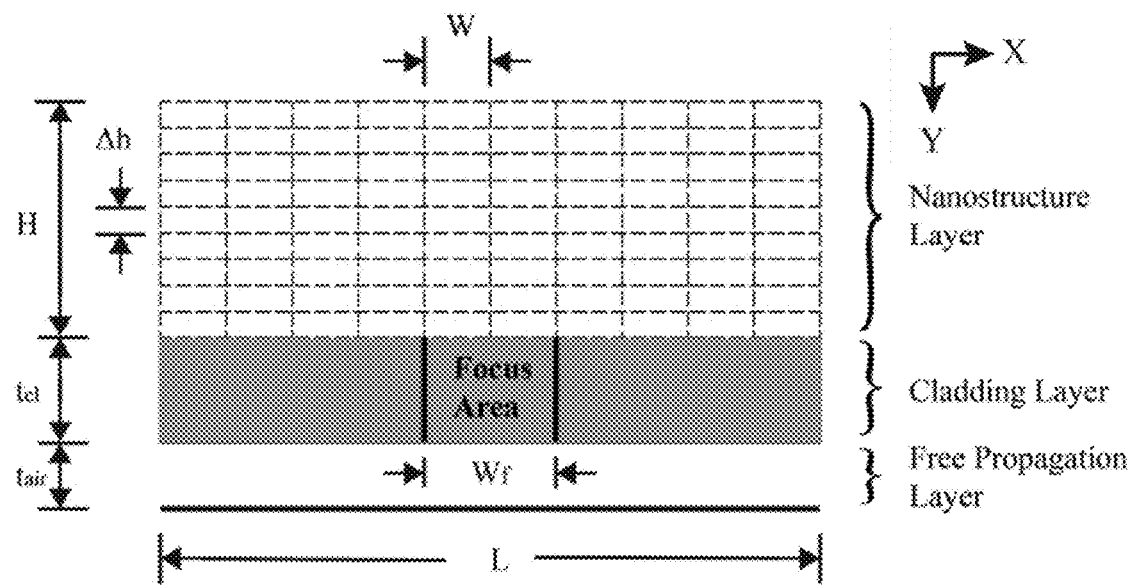
FIG. 21 is a schematic diagram of a geometry for near-field focusing in accordance with an embodiment of the present technology.

Focused light can be useful for imaging (microscopy), patterning (lithography), particle manipulation (trapping), etc. The design method described herein can be used to create nanophotonic structures that can focus light into a region that is far smaller than the far-field diffraction limit in an optically efficient manner compared to subwavelength apertures in opaque films. One embodiment of the geometry is shown in FIG. 21. For simplicity, the nanophotonic structure is assumed to be surrounded by air. A small region in the cladding layer can be delimited as a focusing area, which can be at the left side, the right side or at the center. Both the nanostructure layer and the cladding layer were made of fused silica in simulations, but any dielectric material for the wavelength of interest can be used.

For simplicity, this example uses a normally incident light source of a single wavelength and single polarization state. A new metric is used to evaluate the focusing efficiency. The efficiency (C) can be defined as a ratio of the optical power within the focusing area and the optical power within the entire cladding layer:

$$C = \frac{\iint_{FocusArea} I(x,y) \cdot dx dy}{\iint_{CladdingLayer} I(x,y) \cdot dx dy} \quad (2.0)$$

Example parameters for six designs considered are listed in Table 6.

TABLE 6

Parameters of the initial designs for near-field focusing

| | Geometry | L (nm) | W (nm) | H (nm) | Δh (nm) | $t_{cl}$ (nm) | $t_{air}$ (nm) | Wf (nm) | Position | λ (nm) | Pol. |
|---|---|---|---|---|---|---|---|---|---|---|---|
| Des. 1 | Square | 200 | 5 | 200 | 5 | 20 | 10 | 20 | Right | 240 | TM |
| Des. 2 | Square | 200 | 5 | 200 | 5 | 20 | 10 | 20 | Right | 240 | TE |
| Des. 3 | Square | 200 | 5 | 200 | 5 | 20 | 10 | 20 | Left | 250 | TE |
| Des. 4 | Triangle | 200 | 5 | 200 | 5 | 20 | 10 | 20 | Center | 250 | TM |
| Des. 5 | Triangle | 200 | 5 | 200 | 5 | 20 | 10 | 20 | Center | 240 | TE |
| Des. 6 | Triangle | 200 | 5 | 200 | 5 | 20 | 10 | 20 | Center | 260 | TE |

Figure 22A:
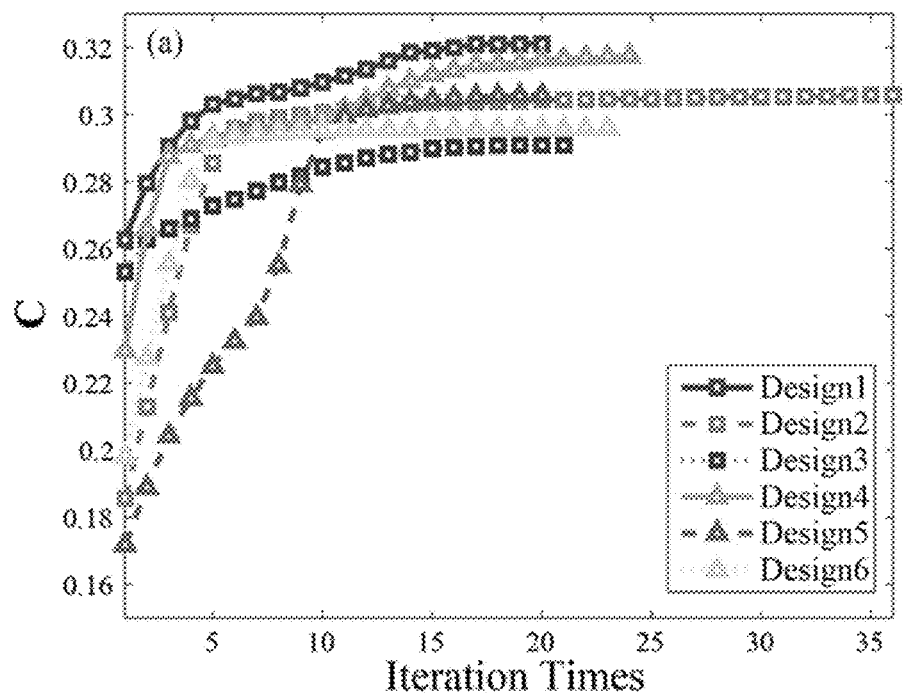
FIG. 22A is a graph of focusing factor versus number of iterations for Example 7, designs 1-6.

FIG. 22A-M summarizes the optimization results for near-field focusing, where FIG. 22A is the focusing factor C vs. iteration number, FIG. 22B is the optimized design for design 1, FIG. 22C is the light field of the TM mode λ=240 nm for design 1, FIG. 22D is the optimized design for design 2, FIG. 22E is the light field of the TE mode at λ=240 nm for design 2, FIG. 22F is the optimized design for design 3, FIG. 22G is the light field of the TE mode at λ=250 nm for design 3, FIG. 22H is the optimized design for design 4, FIG. 22I is the light field of the TM mode at λ=250 nm for design 4, FIG. 22J is the optimized design for design 5, FIG. 22K is the light field of the TE mode at λ=240 nm for design 5, FIG. 22L is the optimized design for design 6, and FIG. 22M is the light field of the TE mode at λ=260 nm for design 6. Each inset figure under each light field of the whole structure shows the intensity distribution of the area including both the cladding layer and the free propagation layer.

As shown in FIG. 22A, the focusing factor C reaches ~0.3 by optimization, especially for designs 1 and 4. The average focusing factors over all the designs is 0.31, and the averaged full-width at half-maximum (FWHM) is 62 nm, which is one fourth of the wavelength in vacuum. To better illustrate the focusing effect, FIG. 23A-F each illustrates a plot of the light intensity along the boundary between the cladding layer and the free propagation layer of both the initial designs and the optimized designs for designs 1-6. In FIG. 23, (a) FIG. 23A corresponds to design 1, (b) FIG. 23B to design 2, (c) FIG. 23C to design 3, (d) FIG. 23D to design 4, (e) FIG. 23E to design 5, and (f) FIG. 23F to design 6. For designs 1, 4, 5 and 6, light intensity is squeezed into the focus area, and the peak intensity is increased at the same time. FWHM is improved to 60 nm from around 75 nm. Designs 2 and 3 do not provide improvement in FWHM, however the secondary peaks outside the focus area are significantly suppressed, leading to a higher C, which leads to higher optical efficiency.

What is claimed is:

1. A method of designing a nanophotonic scattering structure, comprising:
    a) establishing an initial design for a nanophotonic scattering structure including an active layer and an adjacent scattering layer, the scattering layer having an array of discrete pixels wherein each discrete pixel has a geometric profile and is variable between at least two pixel height levels;
    b) identifying a performance metric for the nanophotonic scattering structure;
    c) varying a height of a pixel from the array of discrete pixels among the at least two pixel height levels, said performance metric being a function of the height;
    d) calculating the performance metric for the nanophotonic scattering structure;
    e) repeating steps c) and d) to increase the performance metric, unless the performance metric is not increased by varying the height of the pixel to any of the at least two pixel height levels;
    f) repeating steps c) through e) for each pixel within the array of discrete pixels until steps c) through e) have been performed for every pixel within the array of discrete pixels; and
    g) repeating steps c) through f) until the performance metric reaches an optimized value.

2. The method of claim 1, wherein the nanophotonic scattering structure is a photovoltaic device and the performance metric includes a current generation within the active layer.

3. The method of claim 1, further comprising:
    dividing the initial design into a sum of basis geometries, where each basis geometry in the sum is identical except for a lateral shift;
    pre-computing fields for the basis geometries for all values of N from 1 to a predetermined maximum value; and
    using the pre-computed fields to calculate the performance metric.

4. The method of claim 1, wherein the performance metric includes at least one factor selected from the group consisting of: a spectral light intensity enhancement factor, a spectrally-cumulative light intensity enhancement factor, a spectral short circuit current density enhancement factor, and a spectrally cumulative short circuit current density enhancement factor.

5. The method of claim 1, wherein the nanophotonic scattering structure is a spectrum splitting device having at least two spectral regions within the active layer, and the performance metric includes both a short circuit current density enhancement factor and a spectrum splitting factor.

6. The method of claim 1, wherein the nanophotonic scattering structure is a polarization-splitting device, and the performance metric includes a polarization splitting factor in TM and TE modes.

7. The method of claim 1, wherein the nanophotonic scattering structure is a focusing element, and the performance metric includes a focusing efficiency.

8. The method of claim 1, wherein the pixels are variable between exactly two pixel height levels.

9. The method of claim 1, wherein the pixels are variable between more than two pixel height levels.

10. The method of claim 1, wherein step e) comprises varying the height of the pixel to a pixel height level that increases the performance metric, followed by varying the height of the pixel again to another pixel height level that further increases the performance metric.

11. The method of claim 1, wherein step e) comprises raising the pixel by one predefined height unit from an original height level to an upper height level, and then proceeding to step f) if the performance metric is increased, or if the performance metric is not increased, then lowering the pixel by two predefined height units to a lower height level and then proceeding to step f) if the performance metric is higher than at the original height level, or raising the pixel back to the original height level if the performance metric is highest at the original height level.

12. The method of claim 1, wherein the array of discrete pixels has an initial pattern of pixel heights selected from the group consisting of: a random pattern, a sinusoid grating pattern, a square grating pattern, and a triangle grating pattern.

13. The method of claim 1, wherein the initial design is a one-dimensional design.

14. The method of claim 1, wherein the initial design is a two-dimensional design.

15. A nanophotonic scattering structure product obtained by a process, comprising:
a) establishing an initial design for a nanophotonic scattering structure including a back layer, an active layer disposed over the back layer, and a scattering layer disposed over the active layer, the scattering layer having an array of discrete pixels wherein each discrete pixel has a geometric profile and is variable between at least two pixel height levels;
b) identifying a performance metric for the nanophotonic scattering structure;
c) varying a height of a pixel from the array of discrete pixels among the at least two pixel height levels, said performance metric being a function of the height;
d) calculating the performance metric for the nanophotonic scattering structure;
e) repeating steps c) and d) to increase the performance metric, unless the performance metric is not increased by varying the height of the pixel to any of the at least two pixel height levels;
f) repeating steps c) through e) for each pixel within the array of discrete pixels until steps c) through e) have been performed for every pixel within the array of discrete pixels; and
g) repeating steps c) through f) until the performance metric reaches an optimized value.

16. The structure of claim 15, further comprising a cladding layer disposed between the active layer and the scattering layer.

17. The structure of claim 15, wherein the back layer comprises a back contact layer.

18. The structure of claim 15, wherein the back layer comprises a reflective layer.

19. The structure of claim 15, wherein the scattering structure is a polarization and spectrum splitting structure.

* * * * *